US012593565B2

(12) United States Patent
Qu et al.

(10) Patent No.: US 12,593,565 B2
(45) Date of Patent: Mar. 31, 2026

(54) THIN FILM TRANSISTOR AND METHOD FOR MANUFACTURING THE SAME, DISPLAY SUBSTRATE, AND DISPLAY DEVICE

(71) Applicant: BOE Technology Group Co., Ltd., Beijing (CN)

(72) Inventors: Caiyu Qu, Beijing (CN); Yanjun Hao, Beijing (CN); Huijuan Zhang, Beijing (CN); Yibing Fan, Beijing (CN); Dengyun Chen, Beijing (CN); Zunqing Song, Beijing (CN); Dong Li, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 471 days.

(21) Appl. No.: 17/789,284

(22) PCT Filed: Sep. 30, 2021

(86) PCT No.: PCT/CN2021/122026
§ 371 (c)(1),
(2) Date: Jun. 27, 2022

(87) PCT Pub. No.: WO2023/050250
PCT Pub. Date: Apr. 6, 2023

(65) Prior Publication Data
US 2023/0189565 A1 Jun. 15, 2023

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1201* (2023.02); *H10K 59/1216* (2023.02);
(Continued)

(58) Field of Classification Search
CPC ....................... H10K 59/1213; H10K 59/1201
(Continued)

(56) References Cited

U.S. PATENT DOCUMENTS 5,973,408 A * 10/1999 Nagasaka .............. H10D 64/62
257/751
10,332,916 B2 6/2019 Lee et al.
(Continued)

FOREIGN PATENT DOCUMENTS

CN 104347727 A 2/2015
CN 107293575 A 10/2017
(Continued)

OTHER PUBLICATIONS

Shi Min et al., Part 8.5.3 "Aluminum Metallization" of the Foundations of Semiconductor Manufacturing Technology, Anhui University Press, Apr. 2007, ISBN No. 7-81110-292-7, 11 pages.
(Continued)

*Primary Examiner* — Dzung Tran
(74) *Attorney, Agent, or Firm* — Westman, Champlin & Koehler, P.A.

(57) ABSTRACT

A thin film transistor is provided. The thin film transistor is disposed on a base substrate and includes: a first active layer; a first gate disposed on a side of the first active layer; a first insulating layer disposed on a side of the first gate away from the base substrate; and a source and a drain. The first gate includes a stacked structure including: a first conductive layer; and a first barrier layer disposed on a side of the first conductive layer away from the base substrate, where a side of the first barrier layer away from the base substrate is in direct contact with a side of the first insulating layer proximate to the base substrate. The first barrier layer includes TiNx1, where $0 \leq x1 < 0.2$, and x1 is a molar ratio of N to Ti.

17 Claims, 24 Drawing Sheets

(51) Int. Cl.
  *H10K 59/126* (2023.01)
  *H10D 30/67* (2025.01)

(52) U.S. Cl.
  CPC ....... *H10K 59/126* (2023.02); *H10D 30/6723* (2025.01); *H10D 30/6731* (2025.01); *H10D 30/6734* (2025.01); *H10D 30/6745* (2025.01); *H10D 30/6755* (2025.01)

(58) Field of Classification Search
  USPC .......................................................... 257/40
  See application file for complete search history.

(56) References Cited

U.S. PATENT DOCUMENTS

| | | | |
|---|---|---|---|
| 11,158,693 B2 | 10/2021 | Chung et al. | |
| 11,183,554 B2 | 11/2021 | Lee et al. | |
| 11,189,681 B2 | 11/2021 | Ko et al. | |
| 2002/0050644 A1* | 5/2002 | Matsumoto | H01L 21/28061 257/770 |
| 2012/0146713 A1* | 6/2012 | Kim | H10D 30/675 438/157 |
| 2015/0008428 A1* | 1/2015 | Yamamoto | H01L 29/78648 257/43 |
| 2017/0012135 A1* | 1/2017 | Tanaka | H10D 30/6734 |
| 2017/0294520 A1 | 10/2017 | Lee et al. | |
| 2019/0115369 A1 | 4/2019 | Lee et al. | |
| 2020/0075707 A1 | 3/2020 | Ko et al. | |
| 2020/0111854 A1* | 4/2020 | Chung | H10K 59/1213 |
| 2020/0235196 A1 | 7/2020 | Lee et al. | |
| 2020/0266259 A1* | 8/2020 | Lee | H10K 59/131 |
| 2022/0037435 A1 | 2/2022 | Chung et al. | |
| 2022/0123122 A1 | 4/2022 | Lee et al. | |

FOREIGN PATENT DOCUMENTS

| | | |
|---|---|---|
| CN | 109671717 A | 4/2019 |
| CN | 110875368 A | 3/2020 |
| CN | 111009531 A | 4/2020 |
| CN | 111446275 A | 7/2020 |
| CN | 111584546 A | 8/2020 |
| KR | 20040080895 A | 9/2004 |

OTHER PUBLICATIONS

Translation of Chinese Office Action for Chinese application No. 202180002777.X, dated Jul. 9, 2025, 19 pages.

* cited by examiner (a)
UN (330nm)
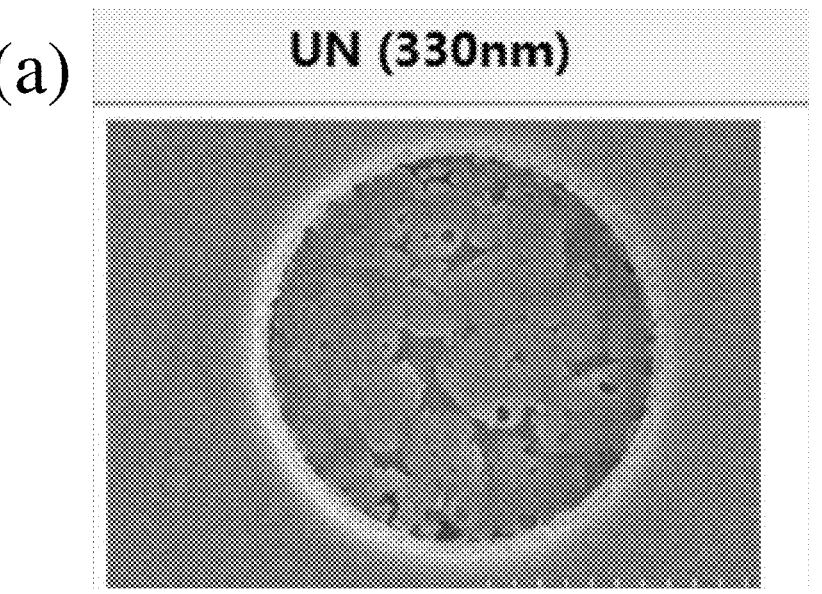
S4800 5.0kV 12.3mm×25.0k SE(M) 1/2/2020 17:23  2.00µm
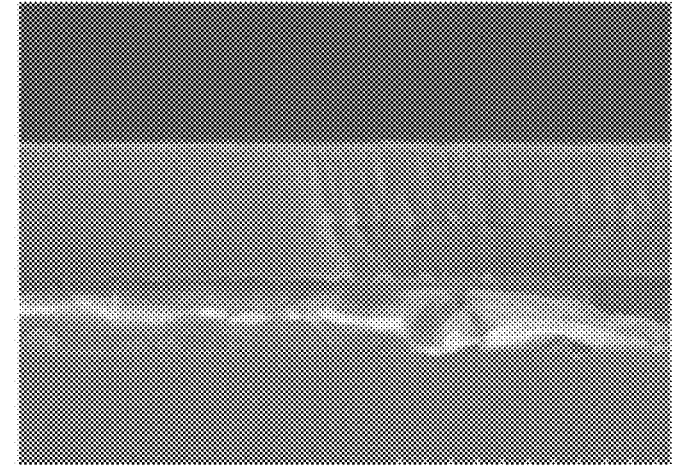
S4800 5.0kV 11.2mm×50.0k SE(M) 1/2/2020 18:37  1.00µm
Etched
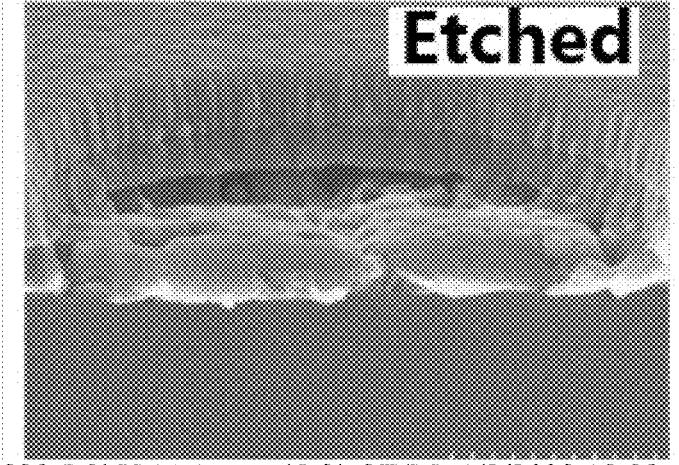
S4800 5.0kV 11.1mm×40.0k SE(M) 1/2/2020 18:03  1.00µm
FIG. 4i (b)
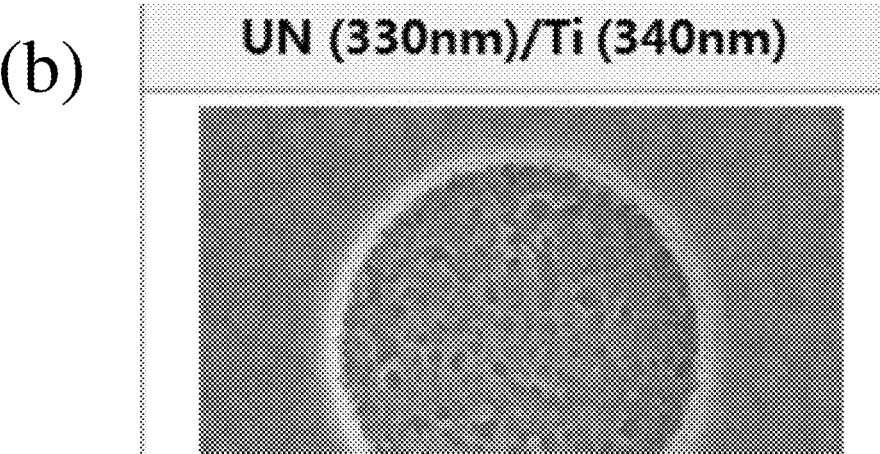
S4800 5.0kV 12.2mm×25.0k SE(M) 1/2/2020 17:16 2.00μm
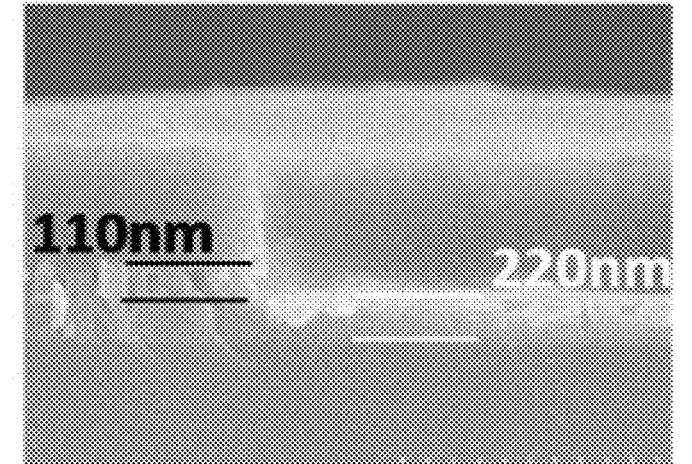
S4800 5.0kV 9.9mm×50.0k SE(M) 1/2/2020 18:34 1.00μm
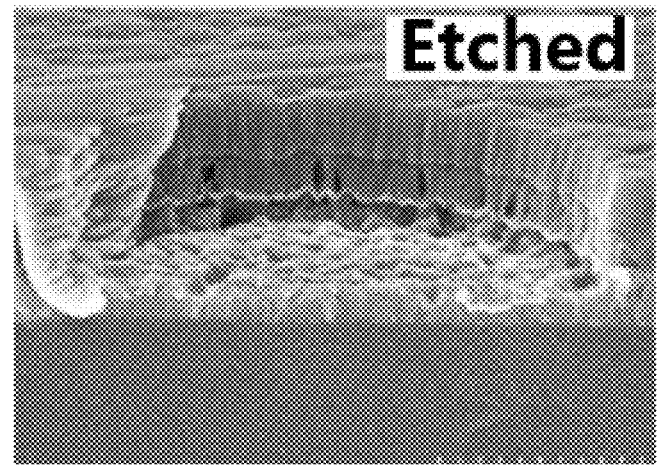
S4800 5.0kV 10.0mm×40.0k SE(M) 1/2/2020 17:48 1.00μm
FIG. 4j

(c)  UN (330nm)/TiN0.5 (120nm)
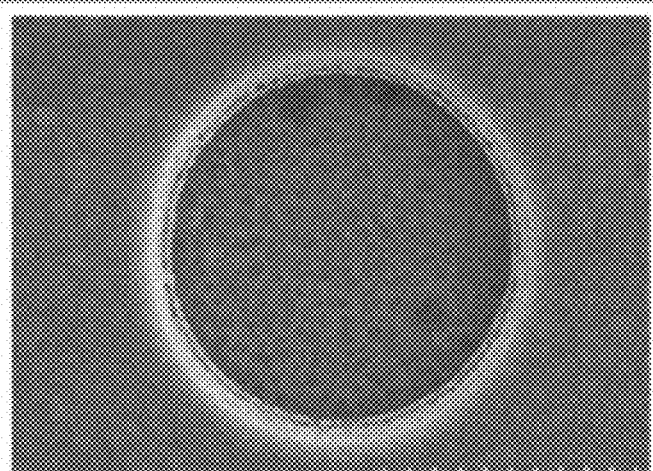
S4800 5.0kV 12.1mm×25.0k SE(M) 1/2/2020 17:14   2.00μm
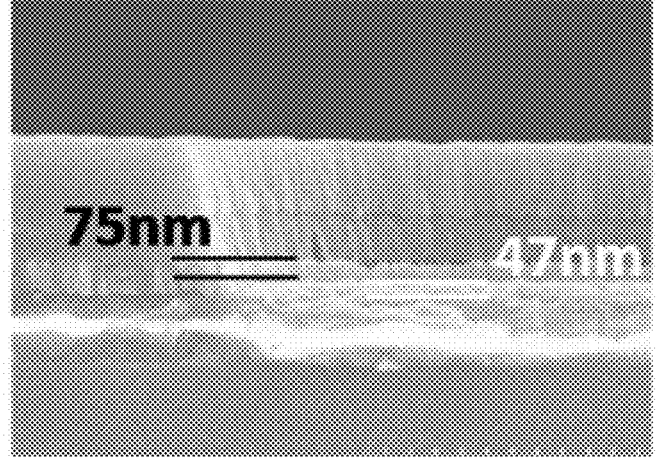
S4800 5.0kV 10.2mm×50.0k SE(M) 1/2/2020 18:31   1.00μm
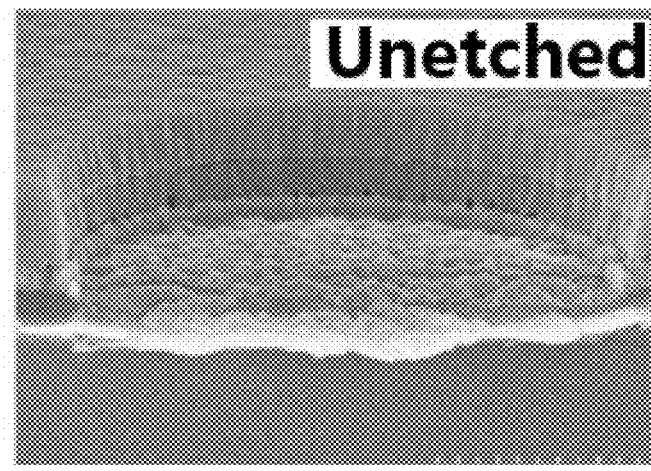
S4800 5.0kV 10.3mm×40.0k SE(M) 1/2/2020 17:39  1.00μm
FIG. 4k (d) UN (330nm)/TiN0.9 (100nm)
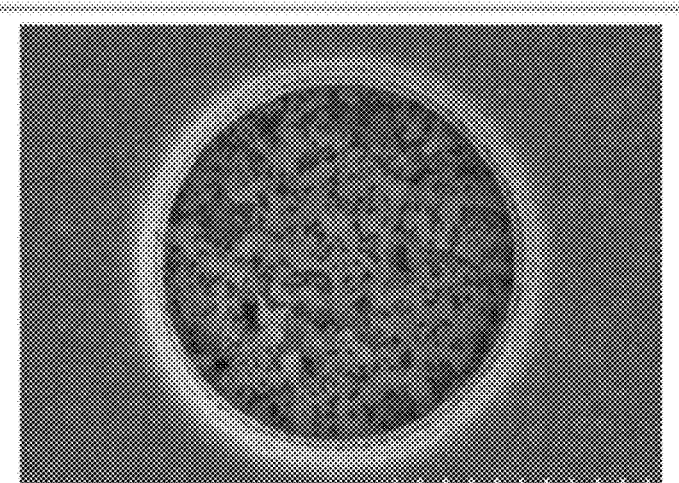
S4800 5.0kV 12.8mm×25.0k SE(M) 1/2/2020 17:13  2.00μm
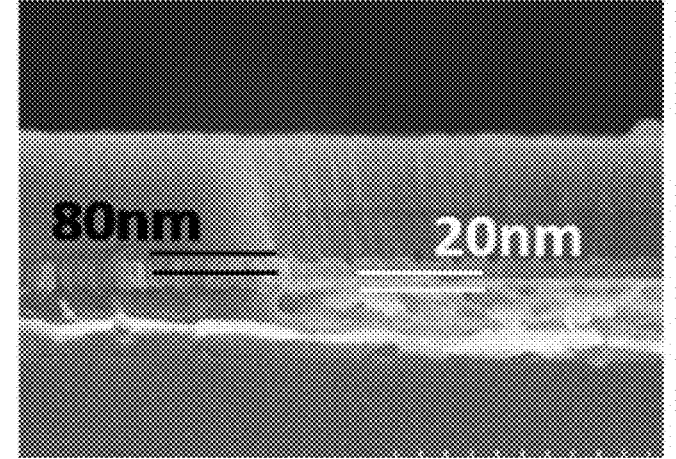
S4800 5.0kV 11.0mm×50.0k SE(M) 1/2/2020 17:34  1.00μm
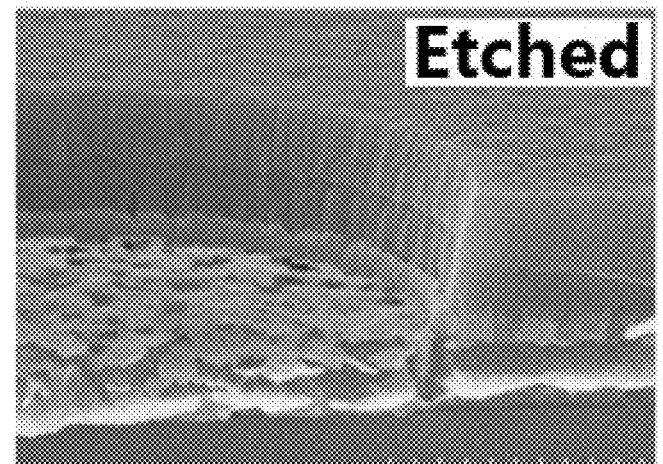
S4800 5.0kV 11.2mm×50.0k SE(M) 1/2/2020 17:35  1.00μm
FIG. 4l

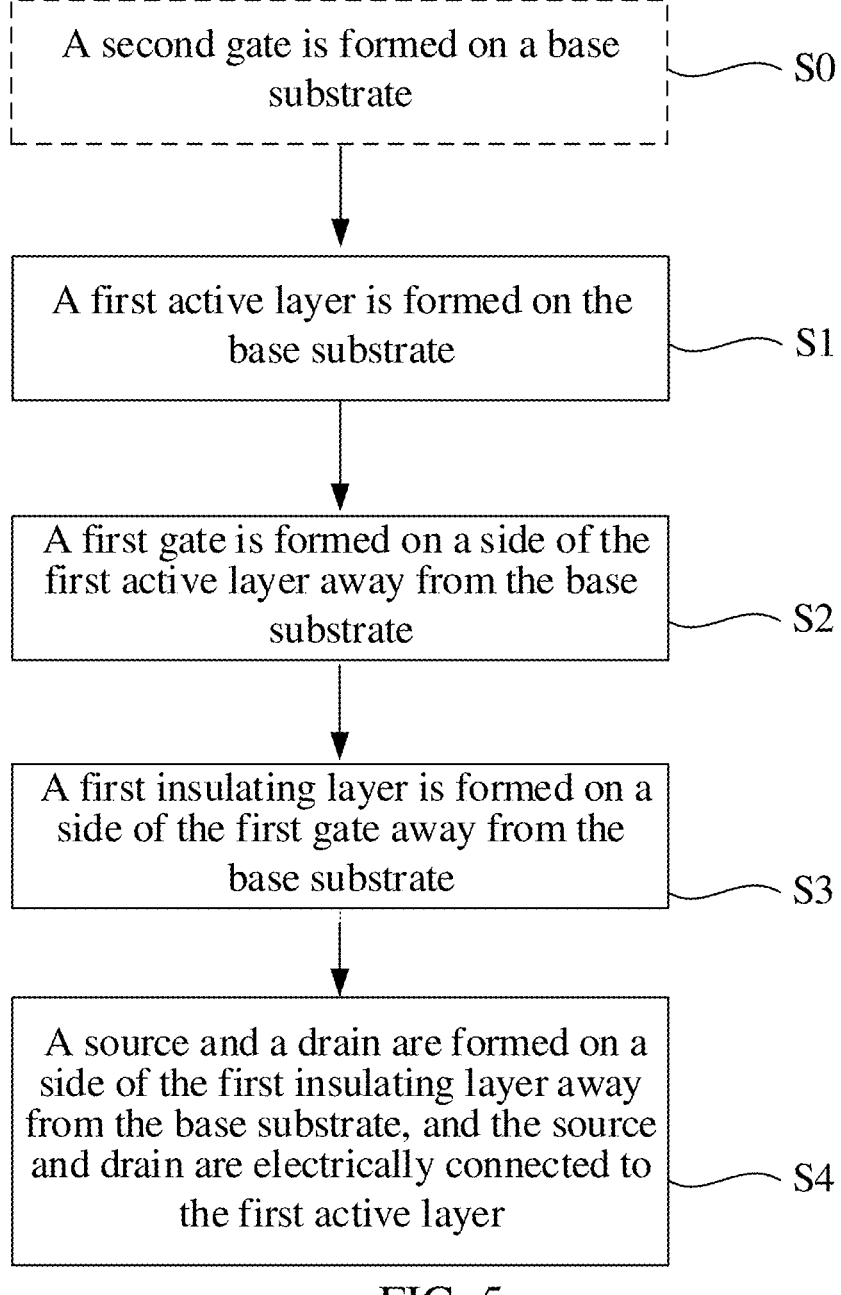

A second gate is formed on a base substrate — S0

A first active layer is formed on the base substrate — S1

A first gate is formed on a side of the first active layer away from the base substrate — S2

A first insulating layer is formed on a side of the first gate away from the base substrate — S3

A source and a drain are formed on a side of the first insulating layer away from the base substrate, and the source and drain are electrically connected to the first active layer — S4

FIG. 5

THIN FILM TRANSISTOR AND METHOD FOR MANUFACTURING THE SAME, DISPLAY SUBSTRATE, AND DISPLAY DEVICE

CROSS-REFERENCE TO RELATED APPLICATION

This application is a Section 371 Stage Application of International Application No. PCT/CN2021/122026, filed on Sep. 30, 2021, entitled "THIN FILM TRANSISTOR AND METHOD FOR MANUFACTURING THE SAME, DISPLAY SUBSTRATE, AND DISPLAY DEVICE", the contents of which is hereby incorporated by reference in its entirety.

TECHNICAL FIELD

The present disclosure relates to a field of display technology, and in particular, to a thin film transistor and a method for manufacturing the same, a display substrate, and a display device.

BACKGROUND

In the related art, a screen of a medium or large size display product has a non-uniform display. As a length of a gate line increases, a delay of a scanning signal will cause insufficient gate turn-on time due to the electrical resistance of the gate line its own, resulting in a poor display effect and non-uniform brightness. Visually, the middle of the screen appears to be cyan with respect to two side edges of the screen, whereas the two side edges of the screen appear to be purple, which seriously affects the display effect.

SUMMARY

In an aspect, a thin film transistor is provided. The thin film transistor is disposed on a base substrate, and the thin film transistor includes: a first active layer, disposed on a side of the base substrate; a first gate, disposed on a side of the first active layer away from the base substrate; a first insulating layer, disposed on a side of the first gate away from the base substrate; a source and a drain, disposed on a side of the first insulating layer away from the base substrate, the source and the drain being electrically connected to the first active layer, where the first gate includes a stacked structure including: a first conductive layer; and a first barrier layer, disposed on a side of the first conductive layer away from the base substrate, where a side of the first barrier layer away from the base substrate is in direct contact with a side of the first insulating layer proximate to the base substrate; and where the first barrier layer includes $TiN_{x1}$, where $0 \leq x1 < 0.2$, and x1 is a molar ratio of N to Ti.

According to some exemplary embodiments, the stacked structure of the first gate further includes: a second barrier layer, disposed between the first conductive layer and the first barrier layer, where the second barrier layer includes $TiN_{x2}$, where $0.1 \leq x2 < 0.8$, and x2 is a molar ratio of N to Ti.

According to some exemplary embodiments, an adhesion force between a material of the first barrier layer and a material of the first insulating layer is greater than an adhesion force between a material of the second barrier layer and the material of the first insulating layer.

According to some exemplary embodiments, the first barrier layer has a first grain size, the second barrier layer has a second grain size, and the first grain size is smaller than the second grain size.

According to some exemplary embodiments, a thickness of the first barrier layer is in a range of 30 nm to 150 nm; and/or, a thickness of the second barrier layer is in a range of 30 nm to 150 nm.

According to some exemplary embodiments, a sum of the thicknesses of the first barrier layer and the thickness of the second barrier layer is in a range of 30 nm to 150 nm.

According to some exemplary embodiments, the stacked structure of the first gate further includes: a third barrier layer, disposed between the first conductive layer and the base substrate, and the third barrier layer including $TiN_{x3}$, where $0 \leq x3 < 0.2$, and x3 is a molar ratio of N to Ti.

According to some exemplary embodiments, the thin film transistor further includes: a second gate, where the second gate is disposed between the first active layer and the base substrate; and the second gate includes a stacked structure, and the stacked structure of the second gate is the same as the stacked structure of the first gate.

According to some exemplary embodiments, the first conductive layer includes an aluminum alloy material.

In another aspect, a method for manufacturing a thin film transistor is further provided, including: forming a first active layer on a base substrate; forming a first gate on a side of the first active layer away from the base substrate; forming a first insulating layer on a side of the first gate away from the base substrate; forming a source and a drain on a side of the first insulating layer away from the base substrate, the source and the drain being electrically connected to the first active layer, where forming the first gate includes: forming a first conductive layer on the side of the first active layer away from the base substrate; and forming a first barrier layer on a side of the first conductive layer away from the base substrate, a side of the first barrier layer away from the base substrate being in direct contact with a side of the first insulating layer proximate to the base substrate, where, the first barrier layer includes $TiN_{x1}$, where $0 \leq x1 < 0.2$, and x1 is a molar ratio of N to Ti.

According to some exemplary embodiments, the method for manufacturing a thin film transistor further includes: forming a second gate on the base substrate before the first active layer is formed.

In yet another aspect, a display substrate is further provided, including: a base substrate; and a first transistor disposed on the base substrate, where the first transistor is the thin film transistor described above.

According to some exemplary embodiments, the display substrate further includes: a capacitor disposed on the substrate, where the capacitor includes a first capacitor electrode and a second capacitor electrode, the first capacitor electrode and the first gate are located in a same layer, the first capacitor electrode has a stacked structure, and the stacked structure of the first capacitor electrode is the same as the stacked structure of the first gate.

According to some exemplary embodiments, the second capacitor electrode is electrically connected to the first active layer, the second capacitor electrode has a stacked structure, and the stacked structure of the second capacitor electrode is the same as the stacked structure of the first gate.

According to some exemplary embodiments, the display substrate further includes a second transistor disposed on the substrate, and the second transistor includes: a third gate, disposed on a side of the base substrate; a second insulating layer, disposed on a side of the third gate away from the base substrate; a second active layer, disposed on a side of the second insulating layer away from the base substrate, where the third gate and the first gate are located in a same layer, and the third gate has a same stacked structure as the first gate.

According to some exemplary embodiments, the second transistor further includes: a fourth gate, disposed on a side of the second active layer away from the base substrate, where the fourth gate has a same stacked structure as the first gate.

According to some exemplary embodiments, the first active layer includes a polysilicon material, and the second active layer includes a semiconductor oxide material.

According to some exemplary embodiments, the display substrate further includes a shielding layer, where the shielding layer is disposed between the first active layer of the first transistor and the base substrate.

In yet another aspect, a display device is further provided, including the display substrate described above.

BRIEF DESCRIPTION OF THE DRAWINGS

Features and advantages of the present disclosure will become more apparent by describing the exemplary embodiments of the present disclosure with reference to the accompanying drawings in detail.

FIG. 4i schematically shows a schematic diagram of a performance of a material of a barrier layer in resisting an etching from a BOE etching solution according to an embodiment of the present disclosure;

FIG. 4j schematically shows a schematic diagram of a performance of a material of another barrier layer in resisting an etching from a BOE etching solution according to an embodiment of the present disclosure;

FIG. 4k schematically shows a schematic diagram of a performance of a material of yet another barrier layer in resisting an etching from a BOE etching solution according to an embodiment of the present disclosure;

FIG. 4l schematically shows a schematic diagram of a performance of a material of yet another barrier layer in resisting an etching from a BOE etching solution according to an embodiment of the present disclosure;

FIG. 5 schematically shows a flowchart of a method for manufacturing a thin film transistor according to an embodiment of the present disclosure;

DETAILED DESCRIPTION OF EMBODIMENTS

Figure 1A:
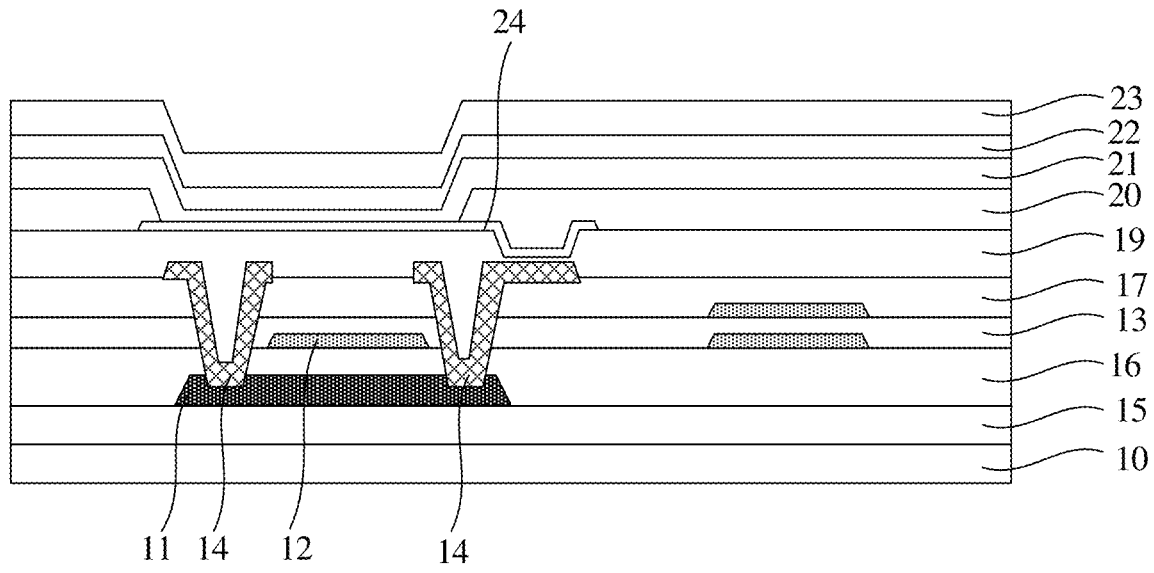
FIG. 1a schematically shows a schematic diagram of a structure of a section of a thin film transistor according to an exemplary embodiment of the present disclosure.

In order to make objective, technical solutions, and benefits of the embodiments of the present disclosure clearer, the technical solutions in the embodiments of the present disclosure will be described clearly and completely with reference to the accompanying drawings. Obviously, the embodiments described are only some, but not all, of the embodiments of the present disclosure. Based on the described embodiments of the present disclosure, all other embodiments obtained by those of ordinary skill in the art without creative work fall within the protection scope of the present disclosure It should be noted that in the accompanying drawings, sizes and relative sizes of elements may be exaggerated for purposes of clarity and/or description. As such, sizes and relative sizes of respective elements are not necessarily limited to those shown in the figures. In the description and the drawings, the same or similar reference numerals refer to the same or similar parts.

When an element is described as being "on", "connected to" or "coupled to" another element, the element may be directly on, connected or coupled to the another element, or an intervening element may be present. However, when an element is described as being "directly on", "directly connected to" or "directly coupled to" another element, there is no intervening element. Other terms and/or expressions used to describe a relationship between elements should be interpreted in a similar manner, such as, "between . . . and" versus "directly between . . . and", "adjacent" versus "directly adjacent" or "on" versus "directly on", etc. In addition, the term "connection" may refer to a physical connection, an electrical connection, a communication connection, and/or a fluid connection. In addition, X, Y, and Z axes are not limited to the three axes of a rectangular coordinate system, and may be interpreted in a broader sense. For example, X, Y, and Z axes may be perpendicular to each other, or may represent different directions that are not perpendicular to each other. For purposes of the present disclosure, "at least one of X, Y and Z" and "at least one selected from a group consisting of X, Y and Z" may be interpreted as X only, Y only, Z only, or any combination of two or more of X, Y and Z, such as XYZ, XYY, YZ and ZZ. As used herein, the term "and/or" includes any and all combinations of one or more of related items listed.

It should be noted that, terms "first", "second", etc. may be used herein to describe various portions, components, elements, regions, layers and/or parts, however, these portions, components, elements, regions, layers and/or parts should not be limited by these terms. Rather, these terms are used to distinguish one portion, component, element, region, layer or part from another. Thus, for example, a first portion, a first component, a first element, a first region, a first layer, and/or a first part discussed below may be termed a second portion, a second component, a second element, a second region, a second layer, and/or a second part, without departing from the teachings of the present disclosure.

For ease of description, spatial relationship terms, such as "above", "below", "left", "right" and the like, may be used herein to describe a relationship between one element or feature and another element or feature as illustrated in the figures. It will be understood that the spatial relationship terms are intended to encompass different orientations of a device in use or operation in addition to an orientation depicted in the figures. For example, if the device in the figures is turned over, elements described as "below" or "beneath" other elements or features would then be oriented "above" or "over" other elements or features.

It should be noted that in the present disclosure, the expression "adhesion force" may refer to a magnitude of a binding force between two material layers in contact. For example, the contact between materials may be between different material layers formed by different processes, or may be between different material layers formed by the same process. The adhesion force indicates a bonding strength between two materials. The greater the bonding strength, the greater the adhesion force, and vice versa, the smaller the bonding strength, the smaller the adhesion force.

FIG. 1a schematically shows a schematic diagram of a structure of a section of a thin film transistor according to an exemplary embodiment of the present disclosure.

Figure 1B:
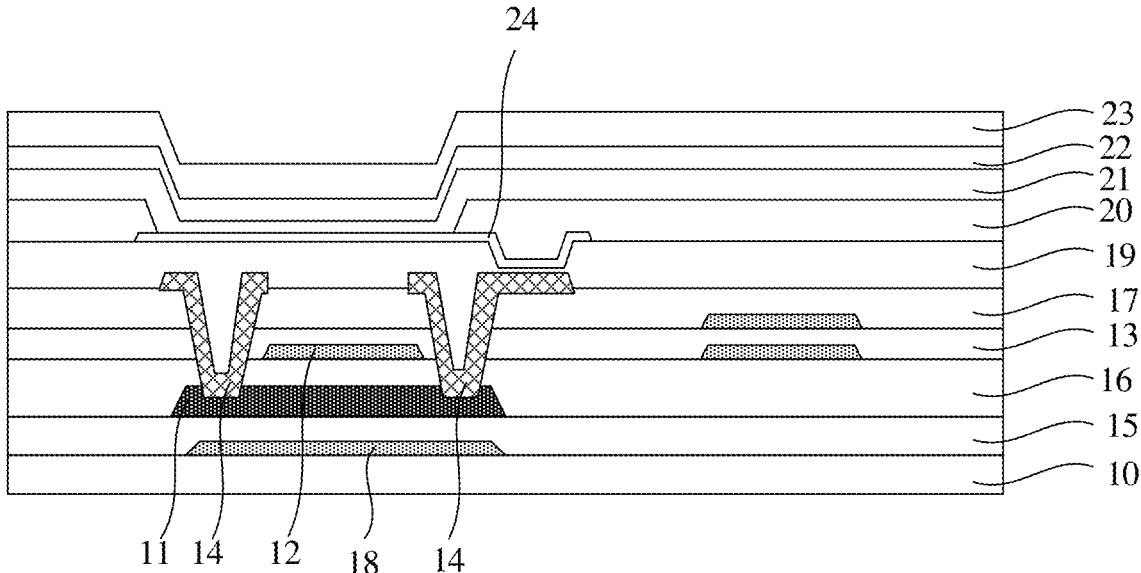
FIG. 1B schematically shows a schematic diagram of a structure of a section of a thin film transistor according to another exemplary embodiment of the present disclosure.

FIG. 1B schematically shows a schematic diagram of a structure of a section of a thin film transistor according to another exemplary embodiment of the present disclosure.

A structure of an exemplary thin film transistor according to the present disclosure will be described in detail below with reference to FIG. 1a.

As shown in FIG. 1a, a thin film transistor is disposed on an upper side of a base substrate 10, wherein the thin film transistor includes a first active layer 11, a first gate 12, a first insulating layer 13, and a source and a drain 14.

The first active layer 11 is disposed on a side of the base substrate 10, for example, disposed on a film structure 15 which is on an upper side of the base substrate 10, where the film structure 15 may be a polyimide layer or a buffer layer. The first active layer 11 may be disposed on the polyimide layer, or may be disposed on the buffer layer. The film structure 15 may be a single-layer film structure or a multi-layer film structure.

A first gate insulating layer 16 is disposed on the first active layer 11. For example, silicon oxide or silicon nitride may be used as a material of the first gate insulating layer 16, or a double-layer structure composed of a silicon oxide film and a silicon nitride film may be used, or the like.

The first gate 12 is disposed on a side of the first active layer 11 away from the base substrate 10, for example, disposed on the first gate insulating layer 16.

The first insulating layer 13 is disposed on a side of the first gate 12 away from the base substrate 10. For example, the first insulating layer 13 is disposed on a side of the first gate insulating layer 16 away from the base substrate 10, and the first insulating layer 13 covers the first gate 12.

The source and the drain 14 are disposed on a side of the first insulating layer 13 away from the base substrate 10, and the source and the drain 14 are electrically connected to the first active layer 11. For example, an interlayer insulating layer 17 is disposed on the side of the first insulating layer 13 away from the base substrate 10, the source and the drain 14 are disposed on the interlayer insulating layer 17, and a part of the source and the drain 14 passes through the interlayer insulating layer 17, the first insulating layer 13, and the first gate insulating layer 16 to be electrically connected to the active layer 11.

In an exemplary embodiment of the present disclosure, as shown in FIG. 1b, the thin film transistor may further include a second gate 18 disposed between the first active layer 11 and the base substrate 10, for example, the second gate 18 is disposed between the film structure 15 and the base substrate 10.

In an exemplary embodiment of the present disclosure, a plurality of films are disposed on the source and the drain 14, for encapsulating the thin film transistor. For example, a planarization layer 19, a pixel defining layer 20, a light emitting layer 21, a cathode 22, an encapsulation layer 23, and an anode 24 may be included. The encapsulation layer 23 may include a plurality of inorganic thin films.

Figure 2A:
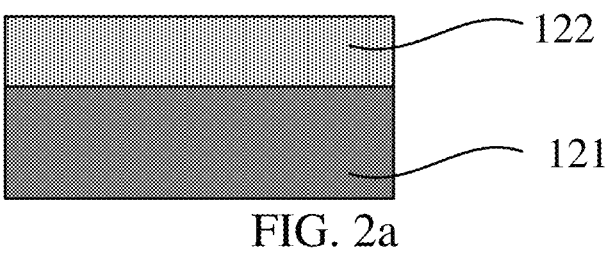
FIG. 2a schematically shows a schematic diagram of a structure of a section of a first gate according to an exemplary embodiment of the present disclosure.
Figure 2B:
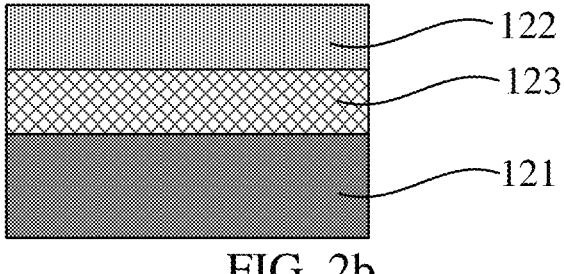
FIG. 2b schematically shows a schematic diagram of a structure of a section of a first gate according to another exemplary embodiment of the present disclosure.
Figure 2C:
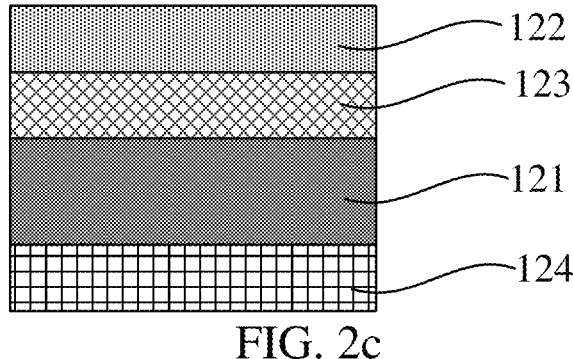
FIG. 2c schematically shows a schematic diagram of a structure of a section of a first gate according to yet another exemplary embodiment of the present disclosure.

FIG. 2a to FIG. 2c schematically show schematic diagrams of structures of sections of first gates according to exemplary embodiments of the present disclosure.

In an exemplary embodiment of the present disclosure, as shown in FIG. 2a, the first gate 12 has a stacked structure including a first conductive layer 121 and a first barrier layer 122, where the first conductive layer 121 is disposed on the side of the first active layer 11 away from the base substrate 10. Specifically, the first conductive layer 121 is disposed on the side of the first gate insulating layer 16 away from the base substrate 10. The first barrier layer 122 is disposed on a side of the first conductive layer 121 away from the base substrate 10, that is, disposed on an upper side of the first conductive layer 121.

A material of the first conductive layer 121 may be aluminum or an aluminum alloy, and the aluminum or an aluminum alloy has a good electrical conductivity as well as a low Young's modulus. The aluminum alloy may include at least one of the following elements: Ce, Zr, Sc, Mn, Ni, and La. In the related art, Mo is used to make a gate metal layer, and a resistivity of Mo is as great as 17.6 microohm-centimeters. In comparison, in the case where the first conductive layer is made of aluminum or the aluminum alloy, a resistivity of the first conductive layer is 4.2 microohm-centimeters, which is much smaller than the resistivity of Mo, and thus the first conductive layer has a good electrical conductivity. Using aluminum and the aluminum alloy may enable a gate line of the first gate to have relatively low electrical resistance, so that a delay time of a scanning signal is relatively short, which may ensure a display effect of a display substrate.

According to the embodiments of the present disclosure, the use of aluminum and aluminum alloy as the material of the first conductive layer may ensure that a screen of a medium or large size product has a uniform display, where the electrical resistance of the gate line is reduced, thereby shortening the delay time of the scanning signal and improving the display effect. In addition, the material of the first gate with low electrical resistance is selected from the aluminum or aluminum alloy material having a Young's modulus of 90 GPa, which is lower than a Young's modulus of a gate made of Mo (with a Young's modulus of 137 GPa) in the related art. The aluminum or aluminum alloy material has a better bending resistance, and in a bending test for a radius of 3 mm, a strain is 5.97 E-03. In the related art, wires made of a Mo metal are all broken after being bent for 2300 times, whereas the aluminum or aluminum alloy material does not break after being bent for 100,000 times with an almost unchanged electrical resistance value. Therefore, the aluminum or aluminum alloy material is more effective when used as a foldable product.

In an embodiment of the present disclosure, the first barrier layer 122 includes $TiN_{x1}$, where there is a range of $0 \leq x1 < 0.2$, and x1 is a molar ratio of N to Ti. Preferably, the range is $0.1 \leq x1 < 0.15$. The first barrier layer 122 is configured to adhere to the first insulating layer 13, so as to prevent peeling between the first barrier layer 122 and the first insulating layer 13. When an N element content and a Ti element content vary, the material of the first barrier layer has different adhesion performances when adhering to an inorganic layer SiN. A molar ratio M of the N content to the Ti content in the first barrier layer 122 is in a range of $0 \leq M < 0.2$, such that the first barrier layer 122 and the first insulating layer 13 may have a relatively good adherence. In other words, the N content in the first barrier layer 122 of the present disclosure is set to be in a relatively low range, such that the first barrier layer 122 may have a good adhesion performance when adhering to the first insulating layer 13, and inhibit a generation of surface defects of the first conductive layer 121 in a manufacturing process as well. For example, a generation of a hillock on the surface of the first conductive layer 121 may be inhibited, and damage to a surface of the metal wire caused by the etching solution may be inhibited. In addition, the first barrier layer 122 may effectively inhibit the damage to the surface of the metal wire from the etching solution during a manufacturing process of the thin film transistor. For example, damage to the surface of the metal wire from a BOE etching solution and an ILD dielectric layer etching solution may be inhibited.

As shown in FIG. 2b, the stacked structure of the first gate 12 may further include a second barrier layer 123, where the second barrier layer 123 is disposed between the first conductive layer 121 and the first barrier layer 122. The second barrier layer 123 includes $TiN_{x2}$, where there is a range of $0.1 \leq x2 < 0.8$, and x2 is a molar ratio of N to Ti. Preferably, x2 is in a range of $0.5 \leq x2 < 0.8$. In an embodiment of the present disclosure, each of the first barrier layer 122 and the second barrier layer 123 is made of a titanium nitride material, and an N element content of titanium nitride has a relatively great influence on performances of titanium nitride, specifically including an ability of titanium nitride to inhibit etching of an etching solution, and an adhesion force of titanium nitride to other materials.

In related experiments, it is found that an influence of the N element content of titanium nitride on its performances is not linear. For example, when the N element content is low, resistance of titanium nitride against etching of the BOE etching solution or the ILD dielectric layer etching solution is relatively strong, and when the N element content is 0, the resistance of titanium nitride against the etching of the BOE etching solution or the ILD dielectric layer etching solution is relatively weak. That is, the N element content needs to be kept in a low range, so as to achieve relatively excellent etching resistance against the etching solution.

In the experiments, it is found that the N element content of titanium nitride also has a great influence on an adhesion force of the material of the first barrier layer to the material of the first insulating layer.

In an embodiment of the present disclosure, the adhesion force of the material of the first barrier layer 122 to the material of the first insulating layer 13 is greater than an adhesion force of the material of the second barrier layer 123 to the material of the first insulating layer 13.

Figure 3A:
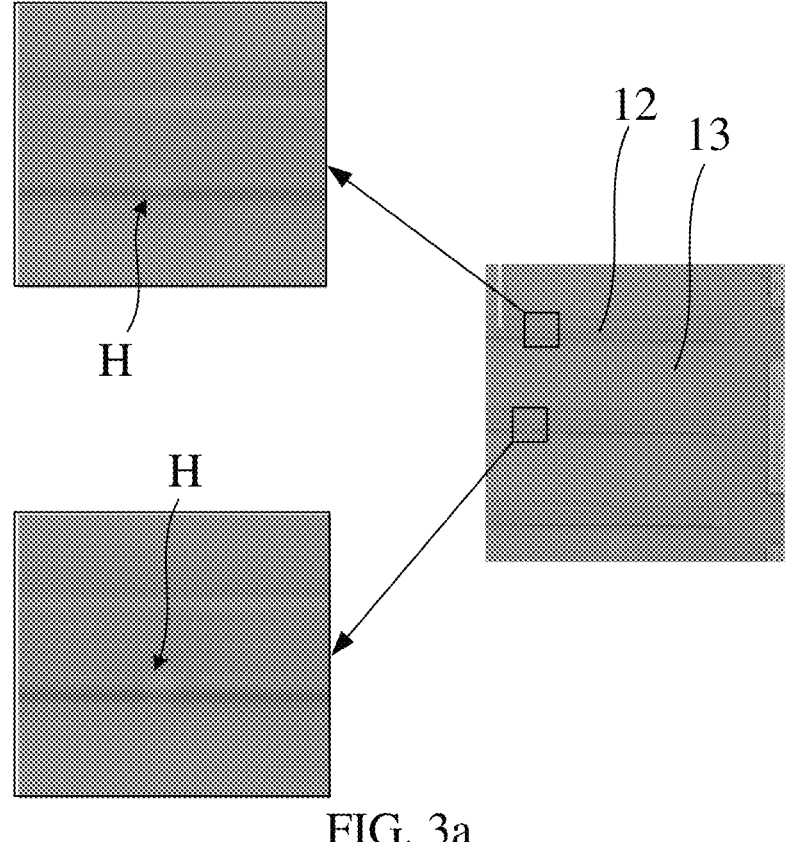
FIG. 3a schematically shows a schematic diagram of adhering a first insulating layer to a first barrier layer according to an embodiment of the present disclosure.

FIG. 3a schematically shows a schematic diagram of adhering a first insulating layer to a first barrier layer according to an embodiment of the present disclosure.

In the material of the first barrier layer material, compared with a titanium nitride material with a higher N content, a titanium nitride material with a lower N content has a greater adhesion force to the material of the first insulating layer 13. For example, $TiN_{x1}$ has a greater adhesion force than that of $TiN_{x2}$, that is, $TiN_{x1}$ may better adhere to the first insulating layer 13. As shown in FIG. 3a, when a value of x1 is set as 0.15, there is relatively good adherence between the first barrier layer 122 including $TiN_{0.15}$ and the first insulating layer 13. After the first insulating layer 13 is laid on the gate material 12, there is no peeling situation. As shown in FIG. 3a, although there are white bright spot regions H within the boxes, the bright spot regions H are positions of holes of the interlayer insulating layer 17, rather than peeling that occurs in a manufacturing process. It may be seen from FIG. 3a that the adhesion force of the first barrier layer 122 to the first insulating layer may be improved by using the titanium nitride material with the lower N content as the material of the first barrier layer 122.

The material of the second barrier layer has a higher N content than the N content of the first barrier layer material, and thus the adhesion force of the material of the second barrier layer 123 to the material of the first insulating layer 13 is less the adhesion force of the material of the first barrier layer 122 to the material of the first insulating layer 13. In contrast, the titanium nitride material with the higher N content in the first conductive layer 121 may better inhibit a defect of the first conductive layer 121 during the manufacturing process. That is, the material of the second barrier layer 123 has a better performance than the material of the first barrier layer 122 in inhibiting the defect of the first conductive layer 121. At the same, the material of the first barrier layer 122 has a better adhesion performance than that of the material of the second barrier layer 123 when adhering to the first insulating layer 13.

Figure 3B:
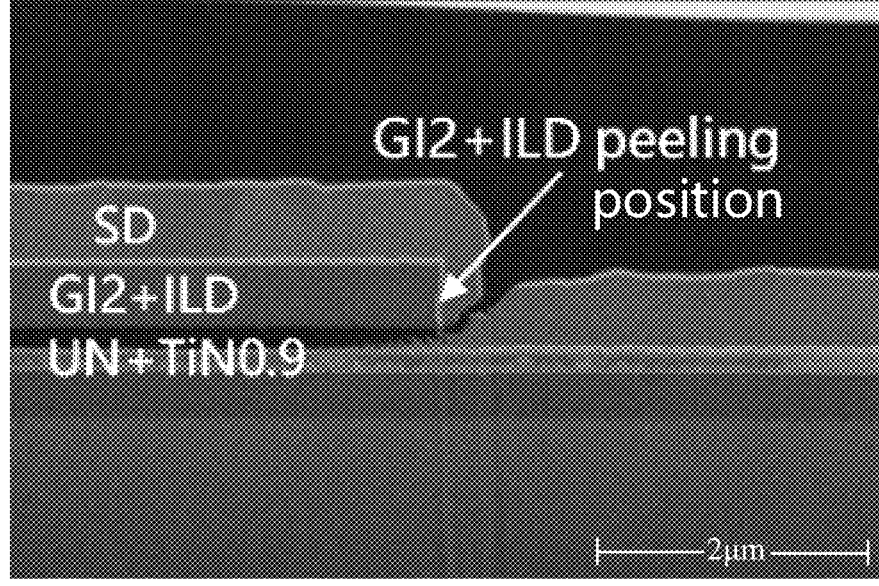
FIG. 3b schematically shows a schematic diagram of peeling between a first barrier layer and a first insulating layer in a case of a high N content of a material of the first barrier layer according to an embodiment of the present disclosure.
Figure 3C:
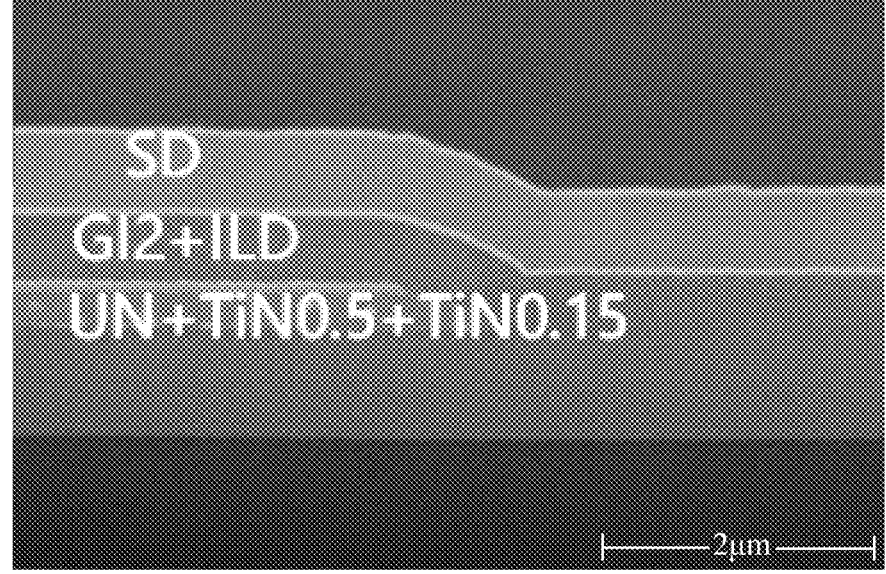
FIG. 3c schematically shows a schematic diagram of adherence between a first barrier layer and a first insulating layer in a case of a low N content of a material of the first barrier layer according to an embodiment of the present disclosure.

FIG. 3b schematically shows a schematic diagram of peeling between the first barrier layer and the first insulating layer in a case of a high N content of a material of the first barrier layer according to an embodiment of the present disclosure. FIG. 3c schematically shows a schematic diagram of adherence between the first barrier layer and the first insulating layer in a case of a low N content of a material of the first barrier layer according to an embodiment of the present disclosure.

As shown in FIG. 3b, when an N content of $TiN_{x1}$ in the first barrier layer is high, it is easy to cause peeling, namely a crack formed between the first barrier layer ($TiN_{0.9}$ in FIG. 3b) and the first insulating layer (GI2+ILD in FIG. 3b), resulting in a low yield. Therefore, it is necessary to reduce the N content of $TiN_{x1}$, so as to improve the adhesion force of the first barrier layer to the first insulating layer. In addition, when TiN has a low N content, the defect of the first conductive layer during the manufacturing process may not be effectively inhibited. In order to better inhibit the defect of the first conductive layer during the manufacturing process, the second barrier layer with the higher N content than that of the first barrier layer is introduced here. For example, the second barrier layer includes $TiN_{x2}$, where there is a range of $0.1 \leq x2 < 0.8$, and preferably, a range of $0.5 \leq x2 < 0.8$, and x2=0.5 in this embodiment, so as to realize an inhibition effect of the second barrier layer on the defect of the first conductive layer. As shown in FIG. 3c, the second barrier layer is disposed between the first barrier layer and the first insulating layer. On the one hand, a crack between the first barrier layer and the first insulating layer may be prevented; on the other hand, a defect of a surface of the first conductive layer in the manufacturing process may be prevented. As shown in FIG. 3c, there is no crack between the first barrier layer and the first insulating layer, and there is no defect in the surface of the first conductive layer.

According to the embodiments of the present disclosure, the first barrier layer 122 is disposed on the first conductive layer 121, so as to improve an adherence state between the first gate 12 and the first insulating layer 13, and prevent peeling between the first gate 12 and the first insulating layer 13. In addition, the second barrier layer 123 disposed between the first conductive layer 121 and the first barrier layer 122 may make up for an insufficiency of the first barrier layer 122 in inhibiting the defect of the surface of the first conductive layer 121.

Figure 4A:
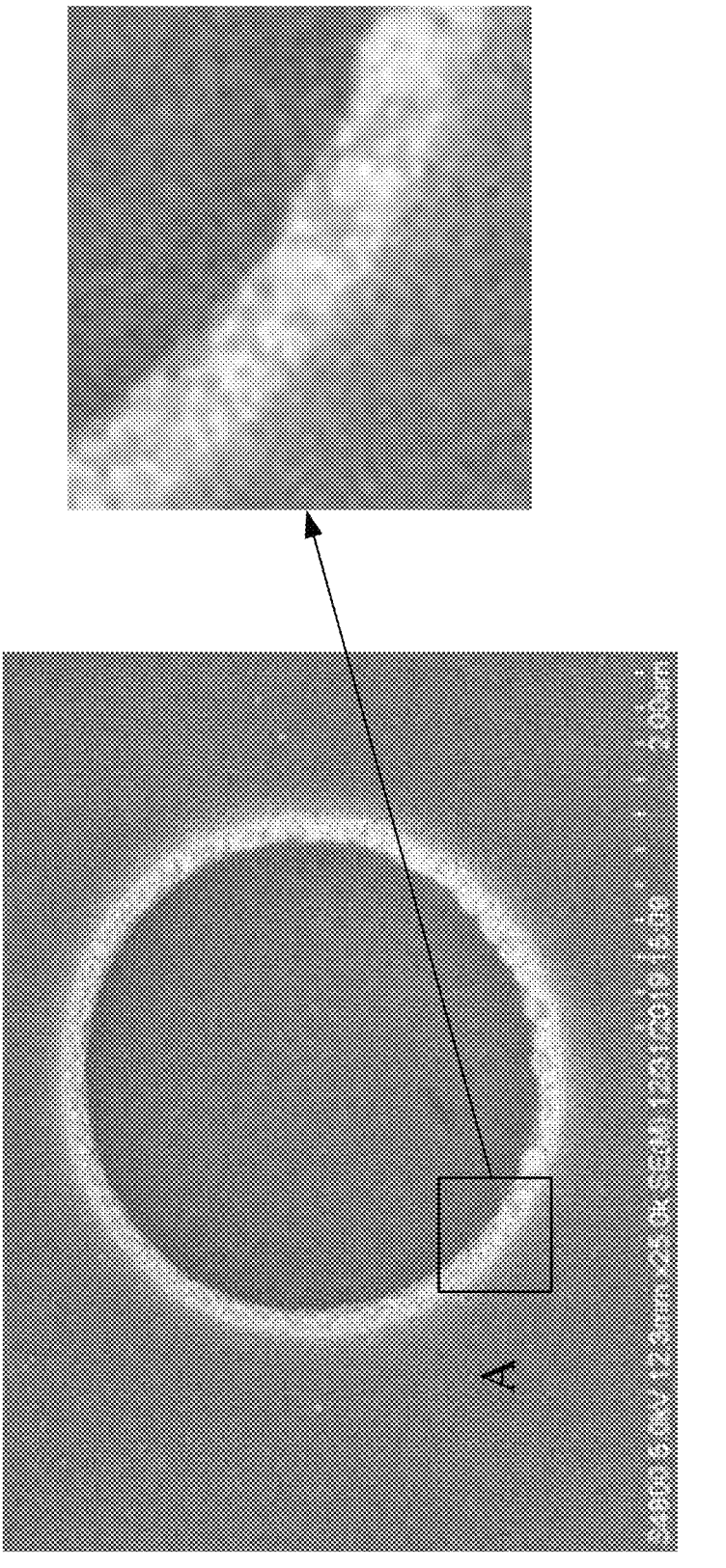
FIG. 4a schematically shows a schematic diagram of a grain size of a first barrier layer according to an embodiment of the present disclosure.

FIG. 4a schematically shows a schematic diagram of a grain size of a first barrier layer according to an embodiment of the present disclosure.

Figure 4B:
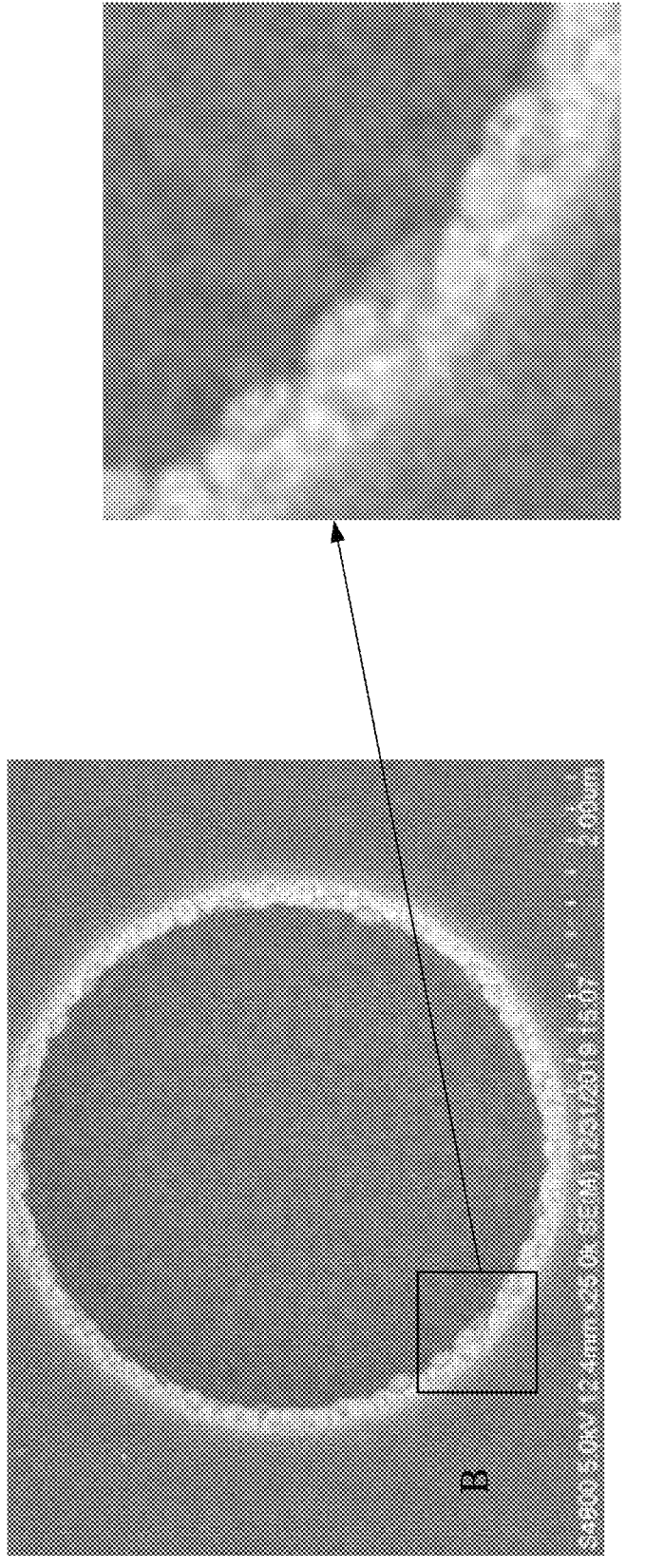
FIG. 4b schematically shows a schematic diagram of a grain size of a second barrier layer according to an embodiment of the present disclosure.

FIG. 4b schematically shows a schematic diagram of a grain size of a second barrier layer according to an embodiment of the present disclosure.

As shown in FIG. 4a, the titanium nitride material with the lower nitrogen content is used as the material of the first barrier layer 122, such as $TiN_{0.15}$, which has a better adhesion performance to the first insulating layer than the titanium nitride material with the higher nitrogen content. In addition, the material of the first barrier layer 122 has finer grains. For example, in the enlarged region of box A, the material has a relatively small grain size ranging between 100 nm and 200 nm, and in terms of resistance to etching, the fine grains have a better etching resistance.

As shown in FIG. 4b, the titanium nitride material with the higher nitrogen content is used as the material of the second barrier layer 123, such as $TiN_{0.5}$, which has a better inhibition effect on the defect of the first conductive layer than the titanium nitride material with the low nitrogen content. In addition, the material of the second barrier layer 123 has coarser grains. For example, in the enlarged region of box B, the material has a relatively large grain size ranging between 300 nm and 500 nm. Compared with the fine grains, the coarse grains have a relatively poor etching resistance.

Figure 4C:
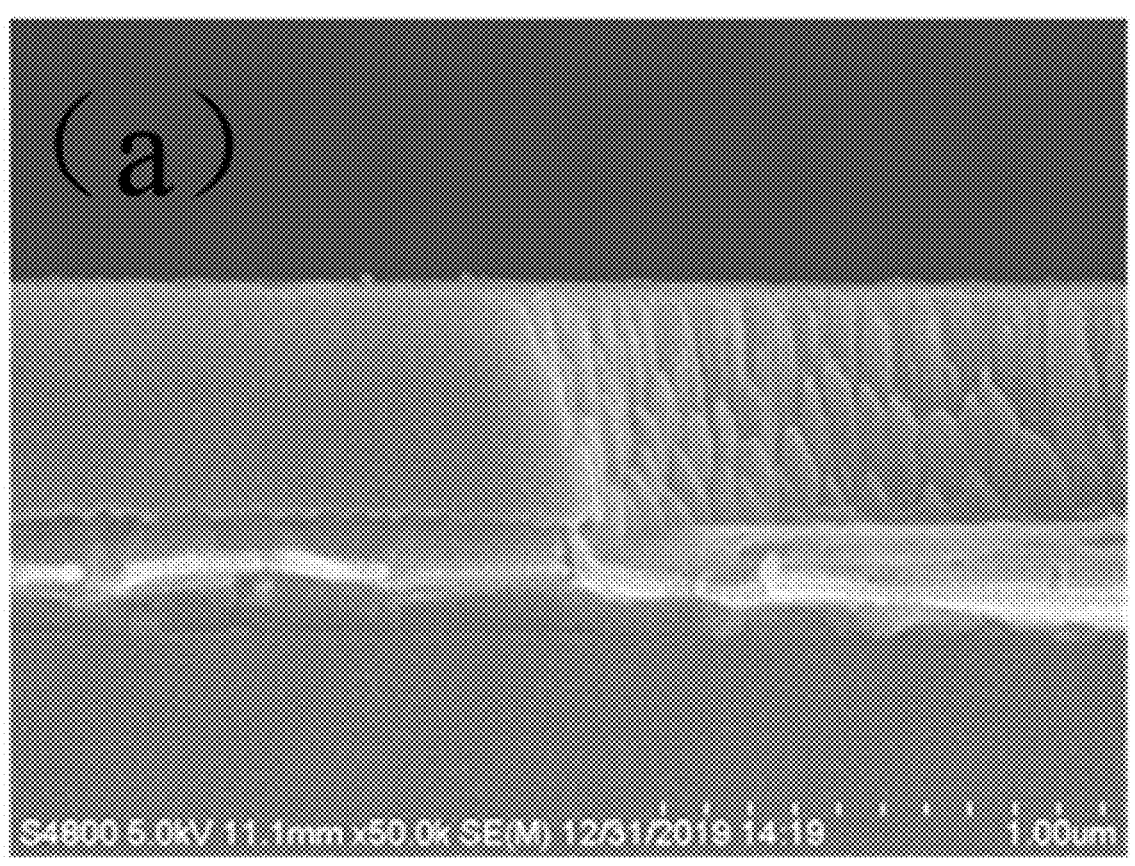
FIG. 4c schematically shows a schematic diagram of a performance of a material of a barrier layer in resisting an etching from an ILD dielectric layer etching solution according to an embodiment of the present disclosure.

FIG. 4c schematically shows a schematic diagram of a performance of a material of a barrier layer in resisting etching from an ILD dielectric layer etching solution according to an embodiment of the present disclosure.

Figure 4D:
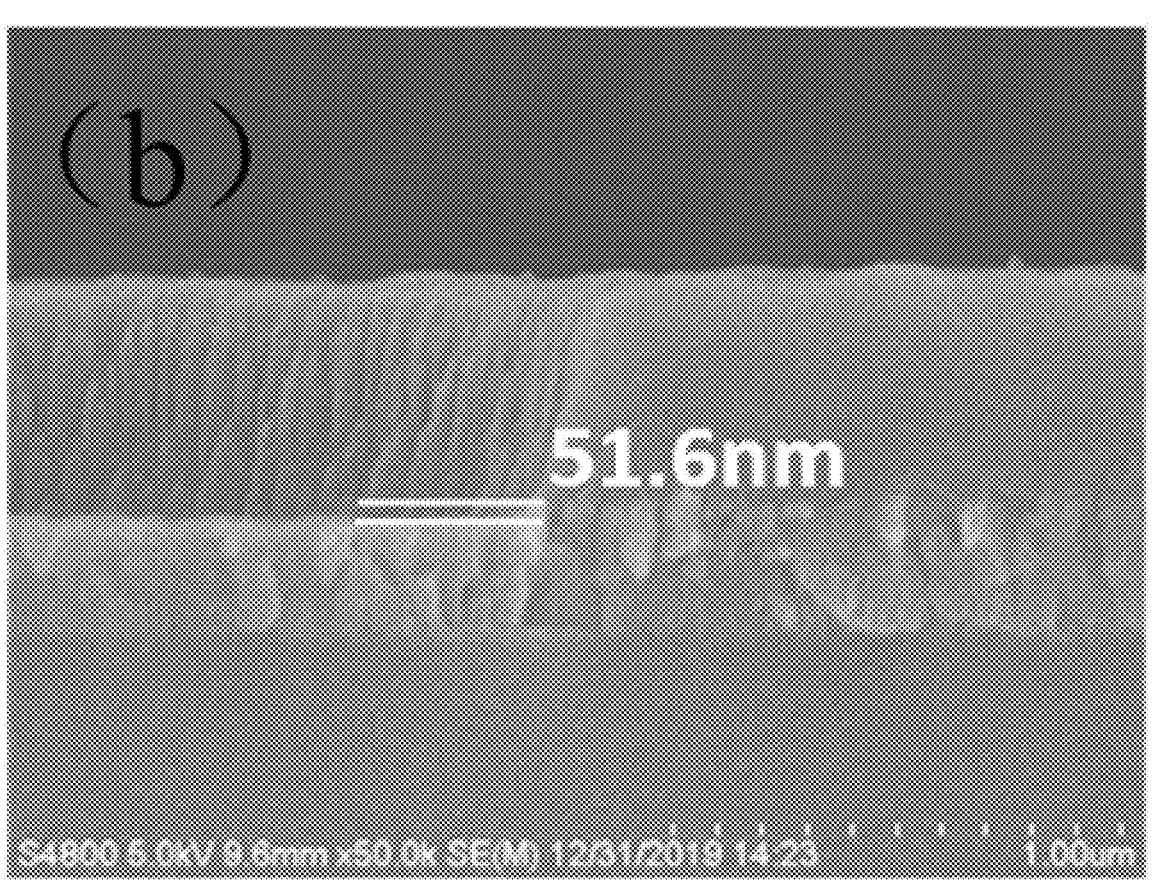
FIG. 4d schematically shows a schematic diagram of a performance of a material of another barrier layer in resisting an etching from an ILD dielectric layer etching solution according to an embodiment of the present disclosure.

FIG. 4d schematically shows a schematic diagram of a performance of a material of another barrier layer in resisting an etching from an ILD dielectric layer etching solution according to an embodiment of the present disclosure.

Figure 4E:
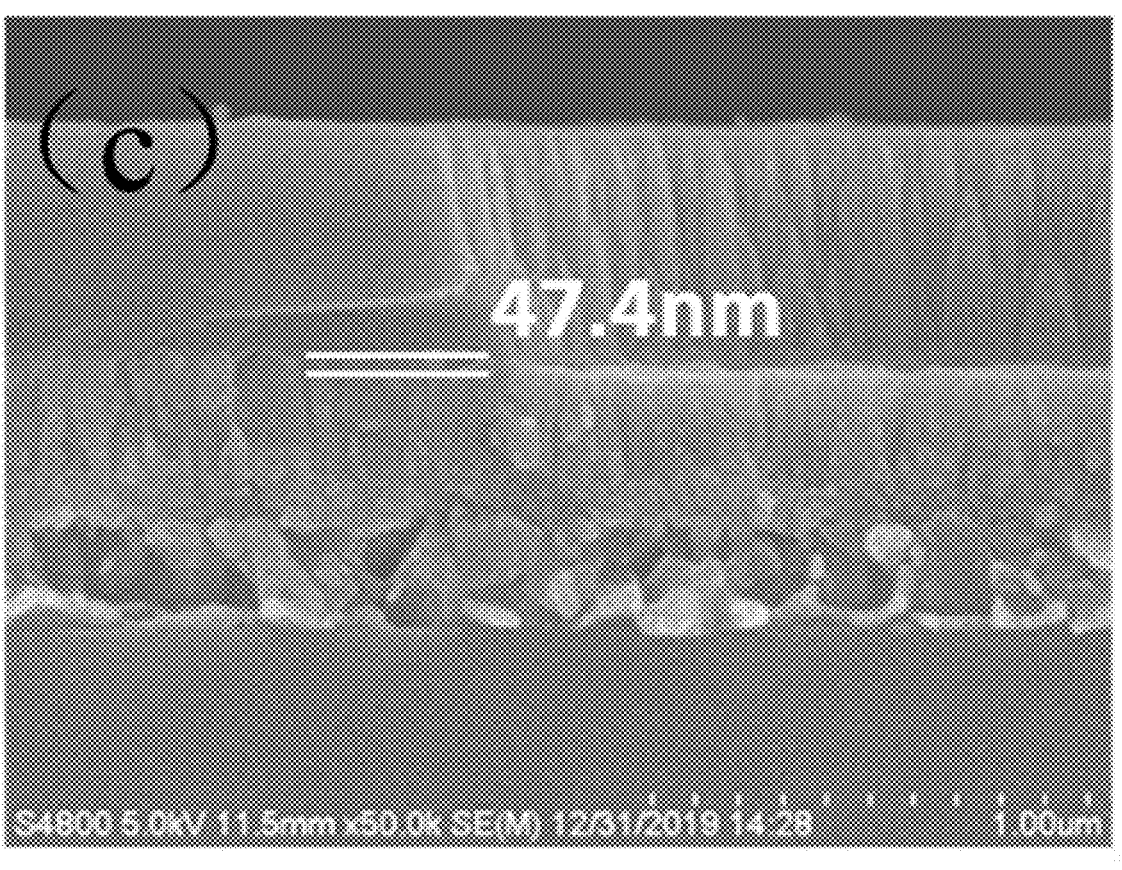
FIG. 4e schematically shows a schematic diagram of a performance of a material of yet another barrier layer in resisting an etching from an ILD dielectric layer etching solution according to an embodiment of the present disclosure.

FIG. 4e schematically shows a schematic diagram of a performance of a material of yet another barrier layer in resisting an etching from an ILD dielectric layer etching solution according to an embodiment of the present disclosure.

Figure 4F:
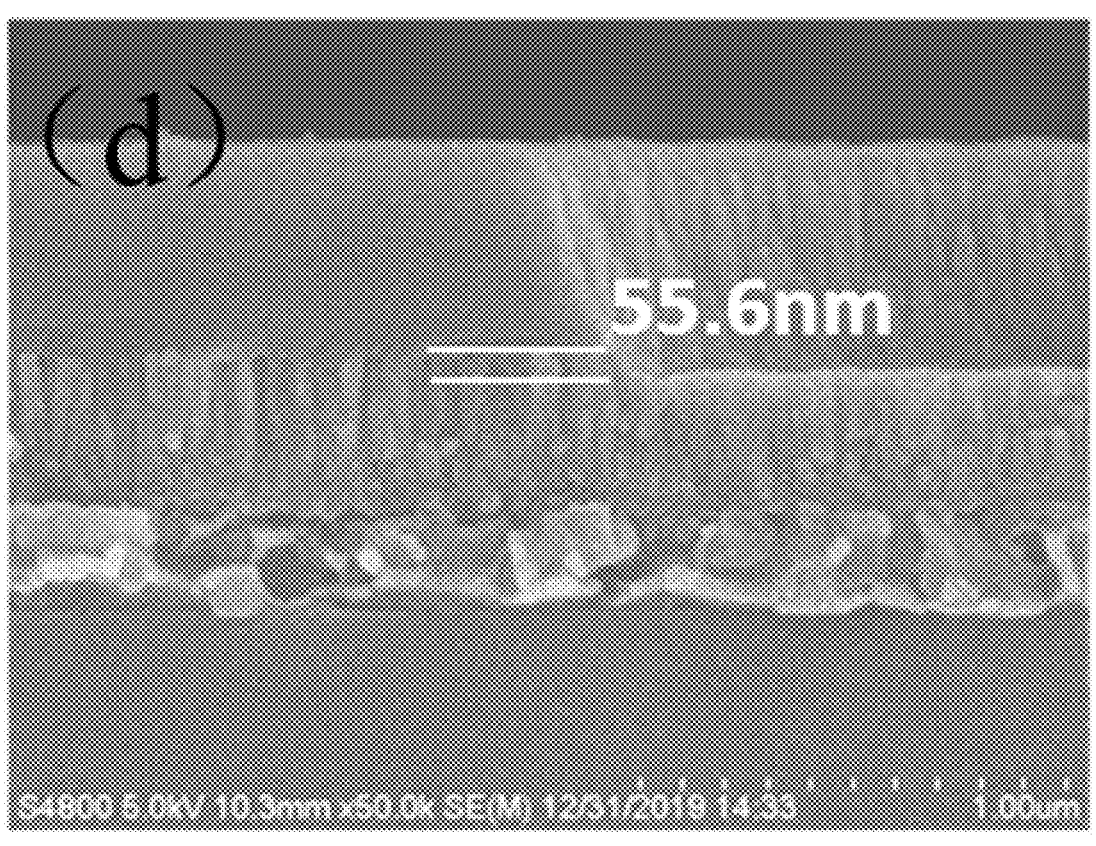
FIG. 4f schematically shows a schematic diagram of a performance of a material of yet another barrier layer in resisting an etching from an ILD dielectric layer etching solution according to an embodiment of the present disclosure.

FIG. 4f schematically shows a schematic diagram of a performance of a material of yet another barrier layer in resisting an etching from an ILD dielectric layer etching solution according to an embodiment of the present disclosure.

Figure 4G:
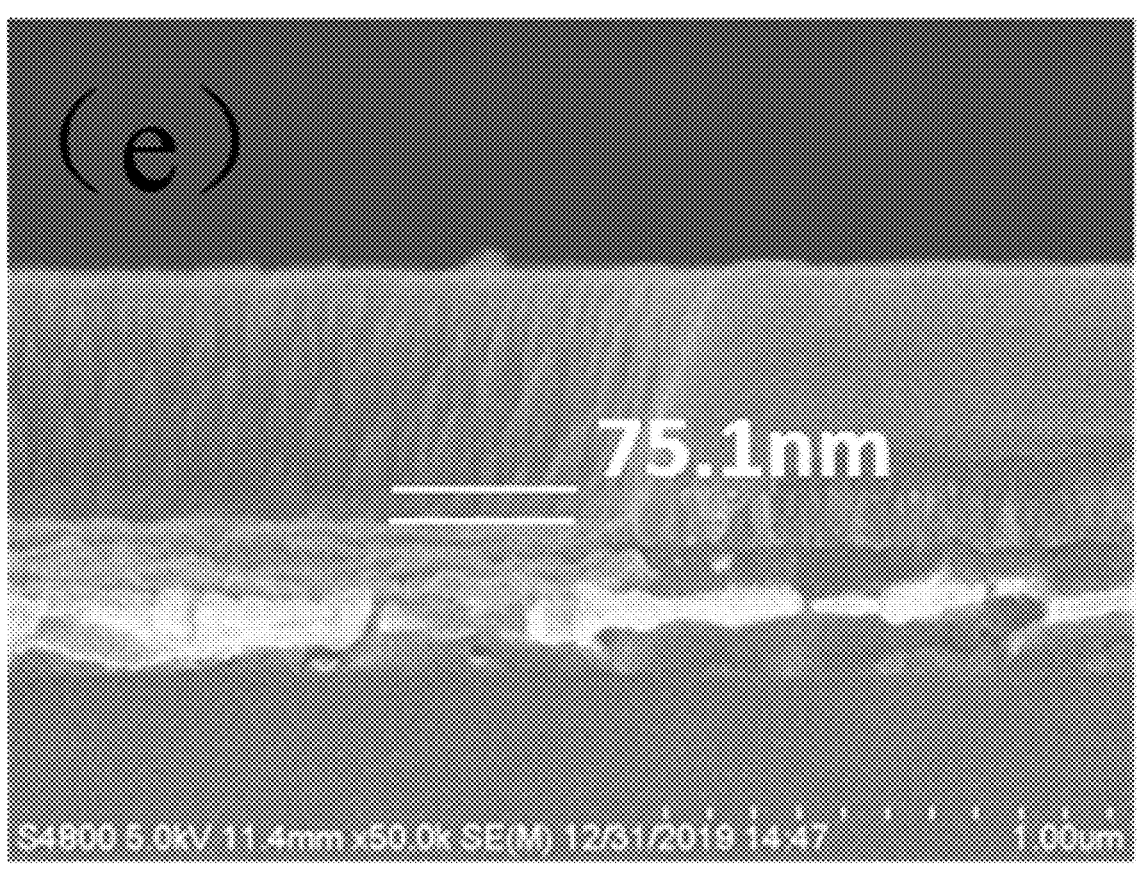
FIG. 4g schematically shows a schematic diagram of a performance of a material of yet another barrier layer in resisting an etching from an ILD dielectric layer etching solution according to an embodiment of the present disclosure.

FIG. 4g schematically shows a schematic diagram of a performance of a material of yet another barrier layer in resisting an etching from an ILD dielectric layer etching solution according to an embodiment of the present disclosure.

Figure 4H:
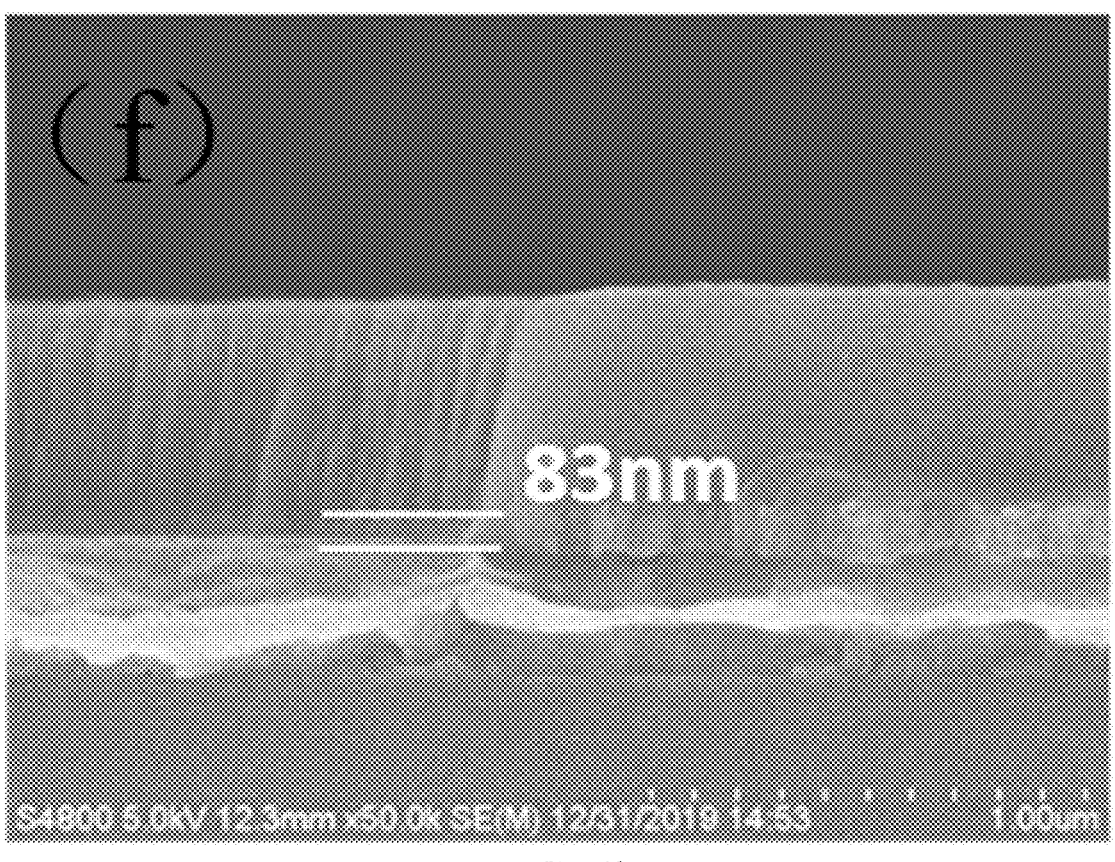
FIG. 4h schematically shows a schematic diagram of a performance of a material of yet another barrier layer in resisting an etching from an ILD dielectric layer etching solution according to an embodiment of the present disclosure.

FIG. 4h schematically shows a schematic diagram of a performance of a material of yet another barrier layer in resisting an etching from an ILD dielectric layer etching solution according to an embodiment of the present disclosure.

During the etching of the ILD dielectric layer etching solution, the titanium nitride materials with different nitrogen contents have different etching resistance. As shown in FIGS. 4c to 4h, (a) to (f) respectively represent a material (a) without a barrier layer, a material (b) including a barrier layer of Ti, a material (c) including a barrier layer of $TiN_{0.15}$, a material (d) including a barrier layer of $TiN_{0.3}$, a material (e) including a barrier layer of $TiN_{0.5}$, and a material (f) including a barrier layer of $TiN_{0.9}$. It may be seen form FIGS. 4c to 4h that an etching depth of (b) is 51.6 nm, an etching depth of (c) is 47.4 nm, an etching depth of (d) is 55.6 nm, an etching depth of (e) is 75.1 nm, and an etching depth of (f) is 83 nm. The etching resistance decreases as the N content increases. That is, the higher the nitrogen content, the greater the etching depth by the ILD dielectric layer etching solution, and thus titanium nitride with the lower content (for example, $TiN_{0.15}$) is used to improve the etching resistance of the first barrier layer.

FIG. 4*i* schematically shows a schematic diagram of a performance of the barrier layer material in resisting an etching from a BOE etching solution according to an embodiment of the present disclosure.

FIG. 4*j* schematically shows a schematic diagram of a performance of a material of another barrier layer in resisting an etching from a BOE etching solution according to an embodiment of the present disclosure.

FIG. 4*k* schematically shows a schematic diagram of a performance of a material of yet another barrier layer in resisting an etching from a BOE etching solution according to an embodiment of the present disclosure.

FIG. 4*l* schematically shows a schematic diagram of a performance of a material of yet another barrier layer in resisting an etching from a BOE etching solution according to an embodiment of the present disclosure.

In addition, the resistance against the etching of the BOE etching solution is also related to the nitrogen content of titanium nitride. As shown in FIGS. 4*d* to 4*l*, (a) to (d) respectively represent a material (a) without a barrier layer, a material (b) including a barrier layer of Ti, a material (c) including a barrier layer of $TiN_{0.5}$, and a material (d) including a barrier layer of $TiN_{0.9}$, where the nitrogen content of titanium nitride increases sequentially. It may be seen form FIGS. 4*d* to 4*l* that when the nitrogen content is lower, the etch resistance is better. Specifically, when the barrier layer of $TiN_{0.5}$ (c) is included, a remaining unetched thickness is 47 nm, and the surface thereof is even. When the barrier layer of $TiN_{0.9}$ (d) is included, a remaining unetched thickness is 20 nm, and the surface thereof has an uneven structure caused by the etching. Therefore, when the N content is 0.5, corrosion by the etching solution of BOE may be effectively inhibited. In addition, the etched surface is a relatively even surface, and thus when other film structures are formed on the surface, the electrical resistance is relatively low. As such, a material of the barrier layer with a lower N content may be used, so that the etched surface is a relatively even surface, and the etching resistance is improved at the same time.

In an exemplary embodiment of the present disclosure, the first barrier layer 122 has a thickness ranging between 30 nm and 150 nm, and preferably, between 100 nm and 120 nm. The second barrier layer 123 has a thickness ranging between 30 nm and 150 nm, and preferably, between 30 nm and 50 nm.

A sum of the thickness of the first barrier layer 122 and the thickness of the second barrier layer 123 is in a range of 30 nm to 150 nm. That is, the sum of the thicknesses of the first barrier layer 122 and the thicknesses of the second barrier layer 123 meet a set range. For example, the sum of the thicknesses may be 50 nm, 100 nm, or the like, and may be adjusted as desired in practice.

In an exemplary embodiment of the present disclosure, as shown in FIG. 2*c*, the stacked structure of the first gate 12 further includes a third barrier layer 124 disposed between the first conductive layer 121 and the base substrate 10. Specifically, the third barrier layer 124 is disposed on the first gate insulating layer 16, and the first conductive layer 121 is disposed on an upper side of the third barrier layer 124. A material of the third barrier layer 124 includes $TiN_{x3}$, where there is a range of $0 \leq x3 < 0.2$, and preferably, a range of $0.1 \leq x3 < 0.15$.

In some embodiments, the conductive layer of the first gate 12 may further be in contact with the first active layer. In this case, in order to avoid the co-dissolution between the conductive layer metal of the first conductive layer and silicon of the first active layer in contact with the conductive layer metal, the third barrier layer 124 as shown in FIG. 2*c* needs to be provided. The third barrier layer 124 may prevent the co-dissolution between the first conductive layer 121 of the first gate 12 and the active layer when the two are in contact with each other.

Figure 4M:
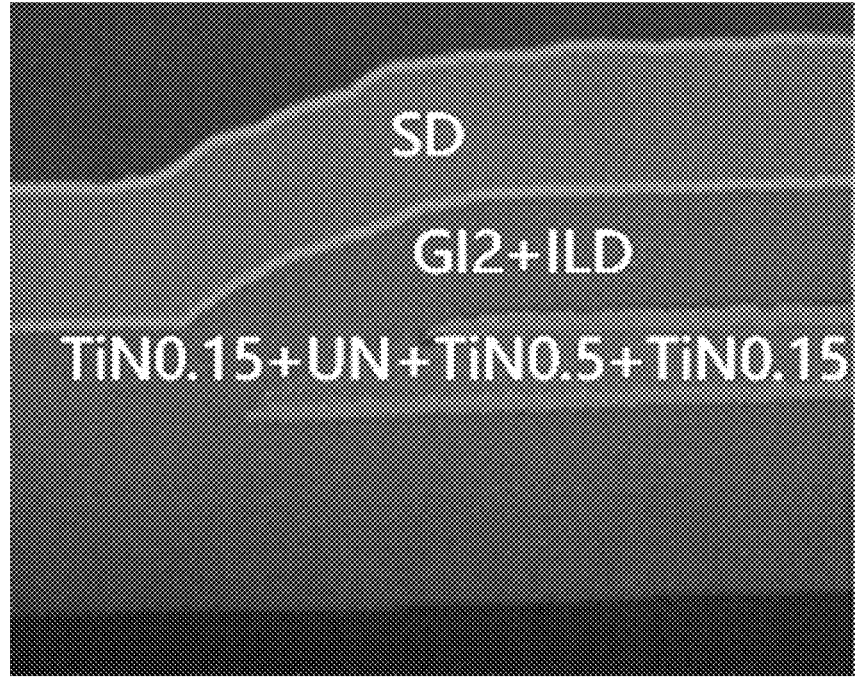
FIG. 4m schematically shows a section of a first gate having a third barrier layer according to an exemplary embodiment of the present disclosure.

FIG. 4*m* schematically shows a section of a first gate having a third barrier layer according to an exemplary embodiment of the present disclosure.

For example, as shown in FIG. 4*m*, the first barrier layer in this embodiment includes $TiN_{0.15}$, the first conductive layer is made of an aluminum alloy, the second barrier layer is made of $TiN_{0.5}$, and the third barrier layer is made of $TiN_{0.15}$. The first gate with the stacked structure has a higher yield when being generated and manufactured.

According to the embodiments of the present disclosure, by providing the third barrier layer 124, on the one hand, it is possible to prevent a hillock of the aluminum alloy (i.e., the first conductive layer) generated at high temperature from damaging an underlying film, on the other hand, peeling with the inorganic layer due to the high N content of TiN is prevented, thereby reducing the probability of a defect during the manufacturing process.

The third barrier layer 124 has a thickness ranging between 30 nm and 150 nm, and preferably, between 30 nm and 50 nm.

In the embodiments of the present disclosure, the first gate structure adopts the stacked structure described above and has low electrical resistance. For example, a structure of the first gate with low electrical resistance includes two layers, namely an Al alloy material layer proximate to the base substrate and a $TiN_{0.15}$ layer. For another example, the structure of the first gate with low electrical resistance includes four layers, namely a $TiN_{0.15}$ layer, an Al alloy material layer, a $TiN_{0.5}$ layer, and a $TiN_0$ layer, sequentially.

In an exemplary embodiment of the present disclosure, the second gate 18 also has a stacked structure, and the stacked structure of the second gate 18 is the same as the stacked structure of the first gate 12. For example, the stacked structure of the second gate 18 may include a first conductive layer, a first barrier layer, and one or more of a second barrier layer and a third barrier layer.

FIG. 5 schematically shows a flowchart of a method for manufacturing a thin film transistor according to an embodiment of the present disclosure.

Figure 6:
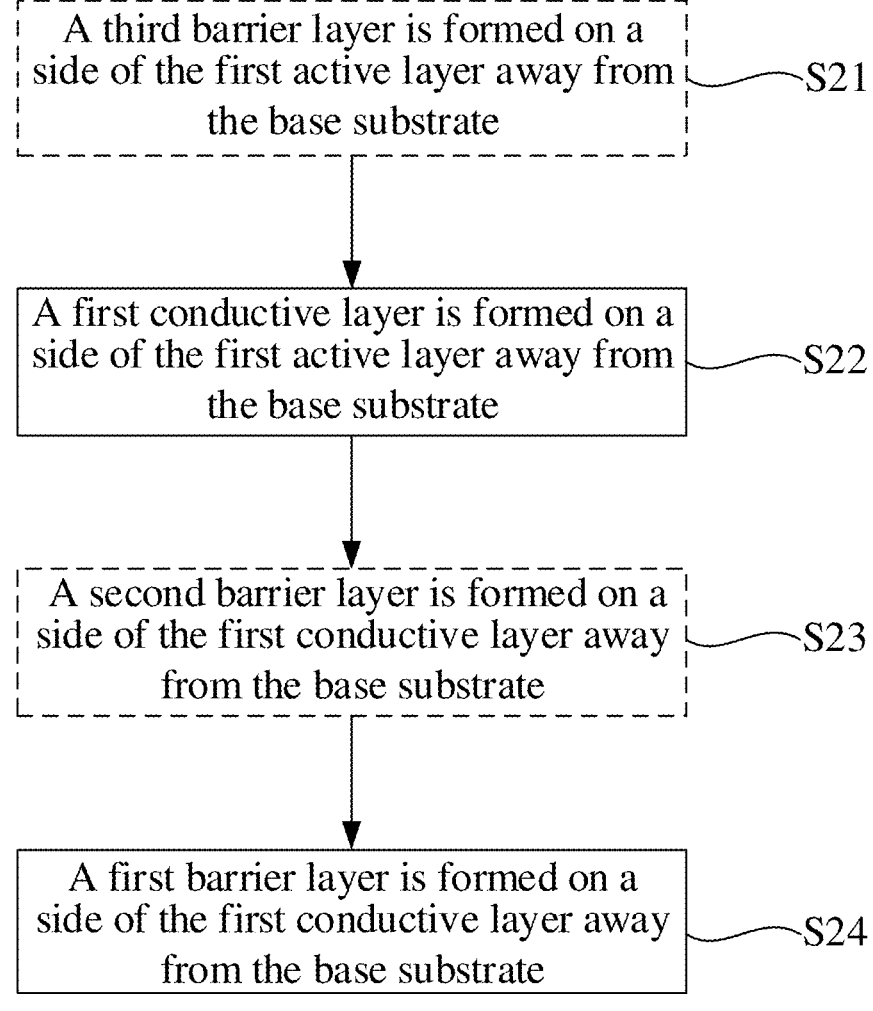
FIG. 6 schematically shows a specific flow for a thin film transistor in step S2 according to an exemplary embodiment of the present disclosure.

FIG. 6 schematically shows a specific flow for a thin film transistor in step S2 according to an exemplary embodiment of the present disclosure.

As shown in FIG. 5, a method for manufacturing a thin film transistor according to an embodiment of the present disclosure includes steps S01 to S05.

Figure 7A:
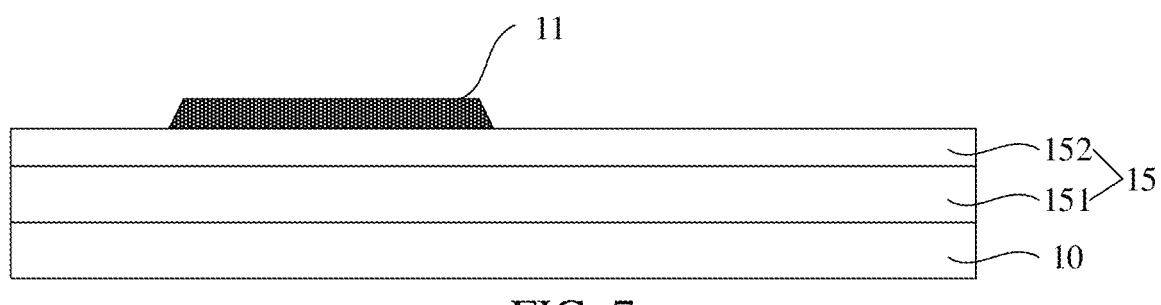
FIG. 7a schematically shows a schematic diagram of an interface structure of a thin film transistor in step S1 according to an exemplary embodiment of the present disclosure.

FIG. 7*a* schematically shows a schematic diagram of an interface structure of a thin film transistor in step S1 according to an exemplary embodiment of the present disclosure.

In step S1, as shown in FIG. 5 and FIG. 7*a*, a first active layer 11 is formed on a base substrate 10.

First, the base substrate 10 (e.g., a glass substrate) is preliminarily cleaned, and a film structure 15 is formed on the base substrate 10. For example, two layers of PI glue is coated on the base substrate 10, and a PI film of about 10 um is formed by curing at 300° C. to 400° C., so as to form a PI film 151.

Then, a thin film is manufactured on the base substrate/PI base, and a specific manufacturing process of the thin film is as follows. A buffer layer 152 (the buffer layer being a $SiN_x/SiO_2$ thin film with bilayer structure) is deposited by using a Plasma Enhanced Chemical Vapor Deposition (PECVD) method, where a silicon nitride layer of 50 nm to 300 nm is deposited first, and a silicon dioxide layer of 100 nm to 300 nm is deposited then. After that, an amorphous silicon layer of 40 nm to 50 nm is deposited as required. After the amorphous silicon layer is deposited, the amorphous silicon layer is heated at a temperature of 400° C. for 0.5 hours to 3 hours. Then, an excimer laser annealing (ELA) process is simultaneously performed on the amorphous silicon region, the polysilicon is patterned to form a channel, and a Vth Doping process is performed to finally form the first active layer 11.

Then, on this basis, a first gate insulating layer 16 (a GI1 thin film) is deposited, and a specific manufacturing process of the first gate insulating layer 16 is as follows. A dielectric layer (the dielectric layer being a $SiN_x/SiO_2$ thin film with bilayer structure) is deposited by using the Plasma Enhanced Chemical Vapor Deposition (PECVD) method, where a silicon oxide layer of 400 nm to 1000 nm is deposited first, and a silicon nitride layer of 100 nm to 500 nm is deposited then.

Figure 7B:
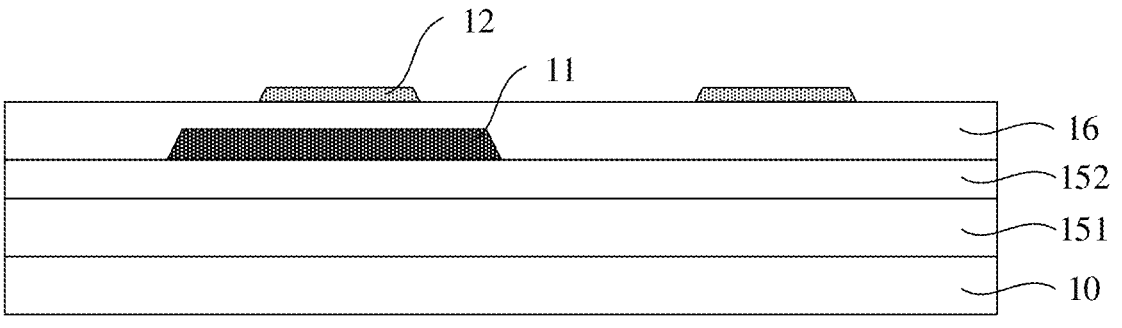
FIG. 7b schematically shows a schematic diagram of an interface structure of a thin film transistor in step S2 according to an exemplary embodiment of the present disclosure.

FIG. 7b schematically shows a schematic diagram of an interface structure of a thin film transistor in step S2 according to an exemplary embodiment of the present disclosure.

In step S2, as shown in FIG. 5 and FIG. 7b, a first gate 12 is formed on a side of the first active layer 11 away from the base substrate 10.

For example, after the first gate insulating layer 16 is formed, the first gate 12 is deposited by a plasma sputtering method, and the layer of the first gate 12 is patterned.

Figure 7C:
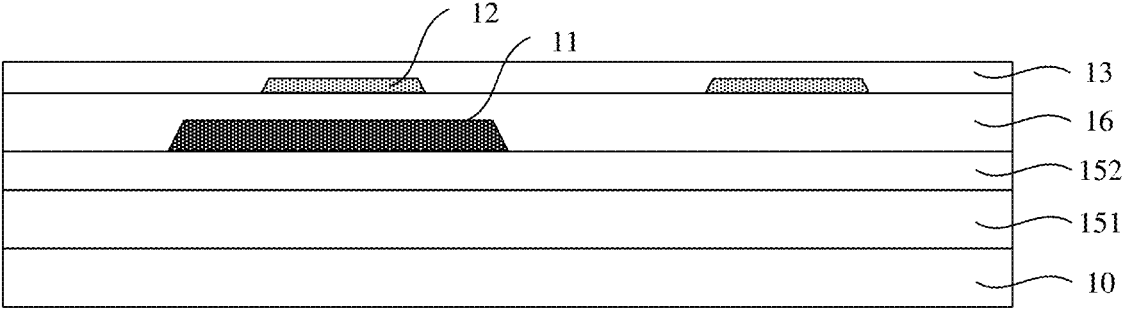
FIG. 7c schematically shows a schematic diagram of an interface structure of a thin film transistor in step S3 according to an exemplary embodiment of the present disclosure.

FIG. 7c schematically shows a schematic diagram of an interface structure of a thin film transistor in step S3 according to an exemplary embodiment of the present disclosure.

In step S3, as shown in FIG. 5 and FIG. 7c, a first insulating layer 13 is formed on a side of the first gate 12 away from the base substrate 10.

The first insulating layer 13 (a GI2 thin film) is deposited on a side of the first gate 12 away from the base substrate 10, and a specific manufacturing process of the first insulating layer 13 is as follows. A dielectric layer (the dielectric layer being SiNx of 100 nm to 150 nm with single-layer structure) is deposited by using the Plasma Enhanced Chemical Vapor Deposition (PECVD) method.

On a basis of the above, an interlayer insulating layer 17 (an ILD thin film) is formed, and a specific manufacturing process of the interlayer insulating layer is as follows. A dielectric layer (the dielectric layer being a $SiN_x/SiO_2$ thin film with bilayer structure) is deposited by using the Plasma Enhanced Chemical Vapor Deposition (PECVD) method, where a silicon oxide layer of 150 nm to 200 nm is deposited first, and a silicon nitride layer of 200 nm to 300 nm is deposited then. The interlayer insulating layer is patterned, and an etching process is performed by using one-step etching or step-by-step etching.

Figure 7D:
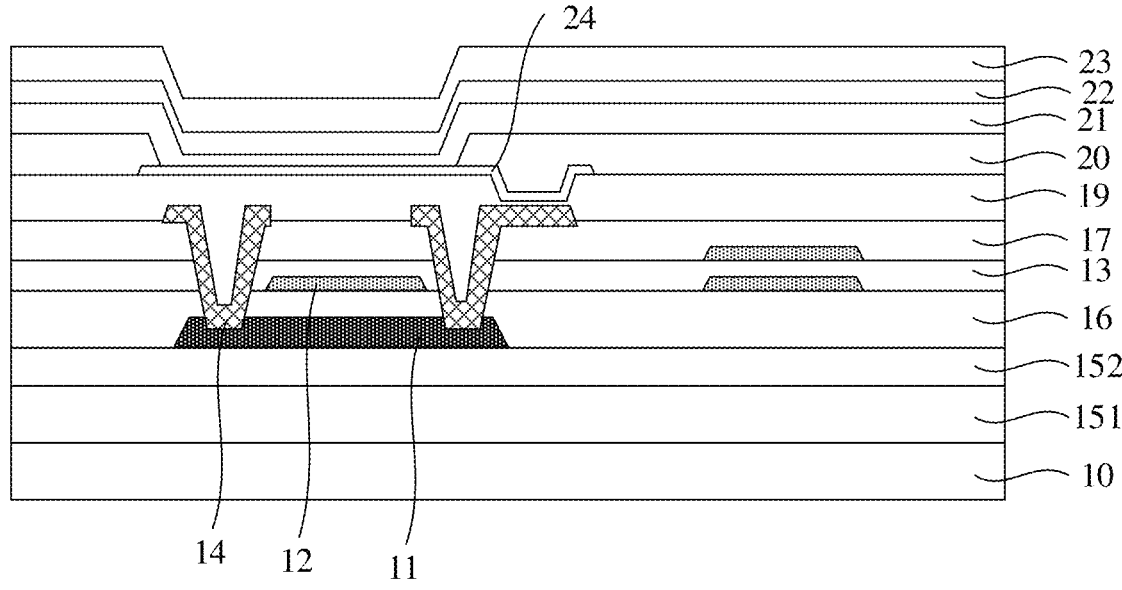
FIG. 7d schematically shows a schematic diagram of an interface structure of a thin film transistor in step S4 according to an exemplary embodiment of the present disclosure.

FIG. 7d schematically shows a schematic diagram of an interface structure of a thin film transistor in step S4 according to an exemplary embodiment of the present disclosure.

In step S4, as shown in FIG. 5 and FIG. 7d, a source and a drain 14 are formed on a side of the first insulating layer

13 away from the base substrate 10, and the source and the drain 14 are electrically connected to the first active layer 11.

After the interlayer insulating layer 17 described above is formed, the source and the drain 14 are subsequently formed, where the source and the drain 14 are electrically connected to the first active layer 11. Then, a planarization layer 19, a pixel defining layer 20, a light emitting layer 21, an anode 24, a cathode 22, and an encapsulation layer 23 and other films are sequentially formed on a side of the source and the drain 14 away from the base substrate 10.

In an exemplary embodiment of the present disclosure, the method for manufacturing a thin film transistor further includes step S0. In step S0, before the first active layer 11 is formed, a second gate 18 is formed on the base substrate 10.

In an exemplary embodiment of the present disclosure, as shown in FIG. 6, in step S2, forming the first gate 12 may specifically include steps S21 to S24. Specific steps for forming the first gate are different according to different structures of the first gate 12.

For example, for the first gate 12 with a structure as shown in FIG. 2a, steps for forming the first gate 12 includes step S22 and step S24. In step S22, the first conductive layer 121 is formed on the side of the first active layer 11 away from the base substrate 10. After the first conductive layer 121 is formed, step S24 is performed, where a first barrier layer 122 is formed on a side of the first conductive layer 121 away from the base substrate 10.

For another example, for the first gate 12 with a structure as shown in FIG. 2b, steps for forming the first gate includes step S22, step S23, and step S24. Specifically, in step S22, the first conductive layer 121 is formed on the side of the first active layer 11 away from the base substrate 10. After the first conductive layer 121 is formed, step S23 is performed, where a second barrier layer 123 is formed on the side of the first conductive layer 121 away from the base substrate. Then, step S24 is performed, where the first barrier layer 122 is formed on the side of the first conductive layer 121 away from the base substrate 10 (i.e., on the second barrier layer 123).

For another example, for the first gate 12 with a structure as shown in FIG. 2c, steps for forming the first gate includes step S21, step S22, step S23, and step S24. Specifically, in step S21, a third barrier layer 124 is formed on the side of the first active layer away from the base substrate. After the third barrier layer 124 is formed, step S22 is performed, where the first conductive layer 121 is formed on the side of the first active layer away from the base substrate, and specifically, the first conductive layer 121 is formed on a side of the third barrier layer 124 away from the base substrate. After the first conductive layer 121 is formed, step S23 is performed, where the second barrier layer 123 is formed on the side of the first conductive layer 121 away from the base substrate. Then, step S24 is performed, where the first barrier layer 122 is formed on the side of the first conductive layer 121 away from the base substrate 10 (i.e., on the second barrier layer 123).

Figure 8:
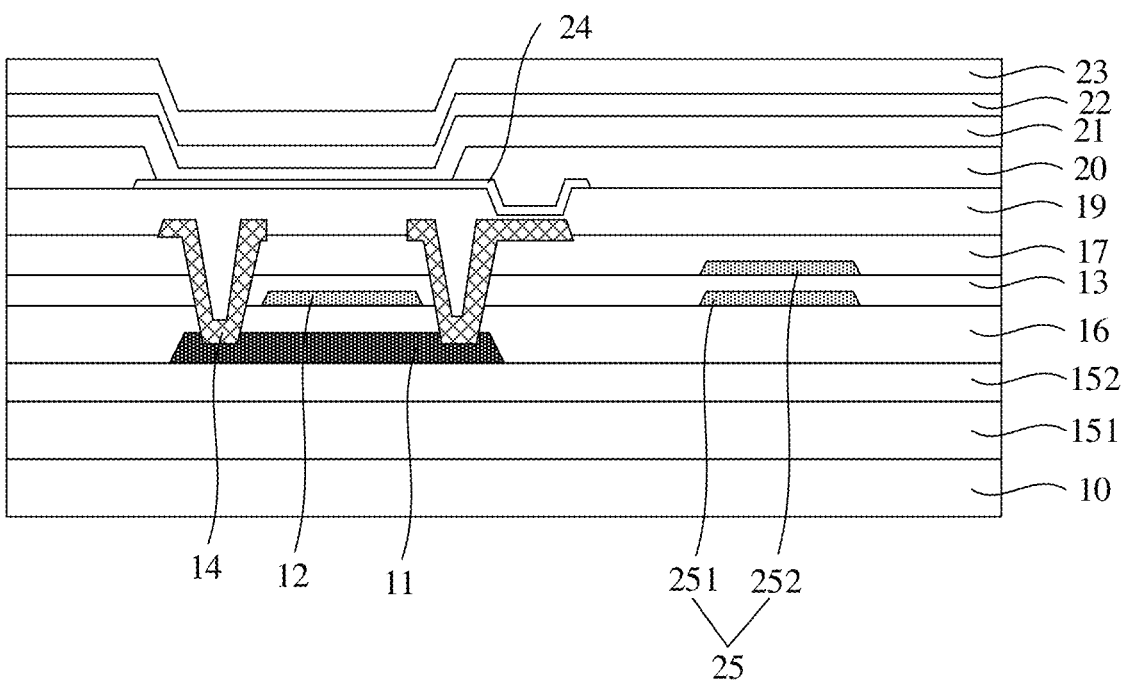
FIG. 8 schematically shows a schematic diagram of a structure of a display substrate according to an exemplary embodiment of the present disclosure.

FIG. 8 schematically shows a schematic diagram of a structure of a display substrate according to an exemplary embodiment of the present disclosure.

As shown in FIG. 8, the display substrate includes the substrate 10 and a first transistor disposed on the substrate 10. The first transistor is the thin film transistor described above. That is, the first transistor includes the first active layer 11, the first gate 12, and the source and the drain 14.

Specifically, the film structure 15 is disposed on an upper layer of the substrate 10, where the film structure 15 may include, for example, the PI film 151 and the buffer layer 152. The first transistor is formed on a side of the buffer layer 152 away from the substrate 10.

The display substrate further includes a capacitor 25 disposed on the substrate, and the capacitor includes a first capacitor electrode 251 and a second capacitor electrode 252. The first capacitor electrode 251 and the first gate 12 are located on the same layer. The first capacitor electrode 251 has a stacked structure, and the stacked structure of the first capacitor electrode 251 is the same as the stacked structure of the first gate 12.

Figure 9:
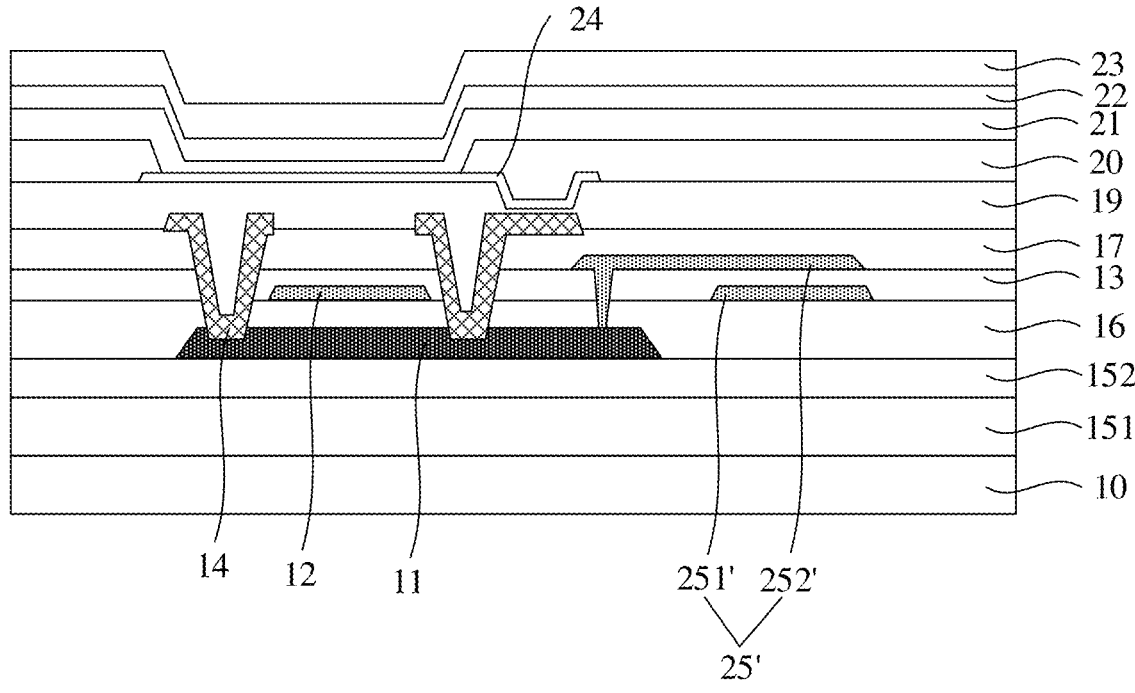
FIG. 9 schematically shows a schematic diagram of a structure of another display substrate according to an exemplary embodiment of the present disclosure.

FIG. 9 schematically shows a schematic diagram of a structure of another display substrate according to an exemplary embodiment of the present disclosure.

FIG. 9 shows a structure of another display substrate, and the display substrate also includes the thin film transistor described above, where the display substrate further includes a capacitor 25' disposed on the substrate. The capacitor 25' includes a first capacitor electrode 251' and a second capacitor electrode 252', the second capacitor electrode 252' is electrically connected to the first active layer 11, and the second capacitor electrode 252' has a stacked structure, where the stacked structure of the second capacitor electrode 252' is the same as the stacked structure of the first gate 12.

Figure 10:
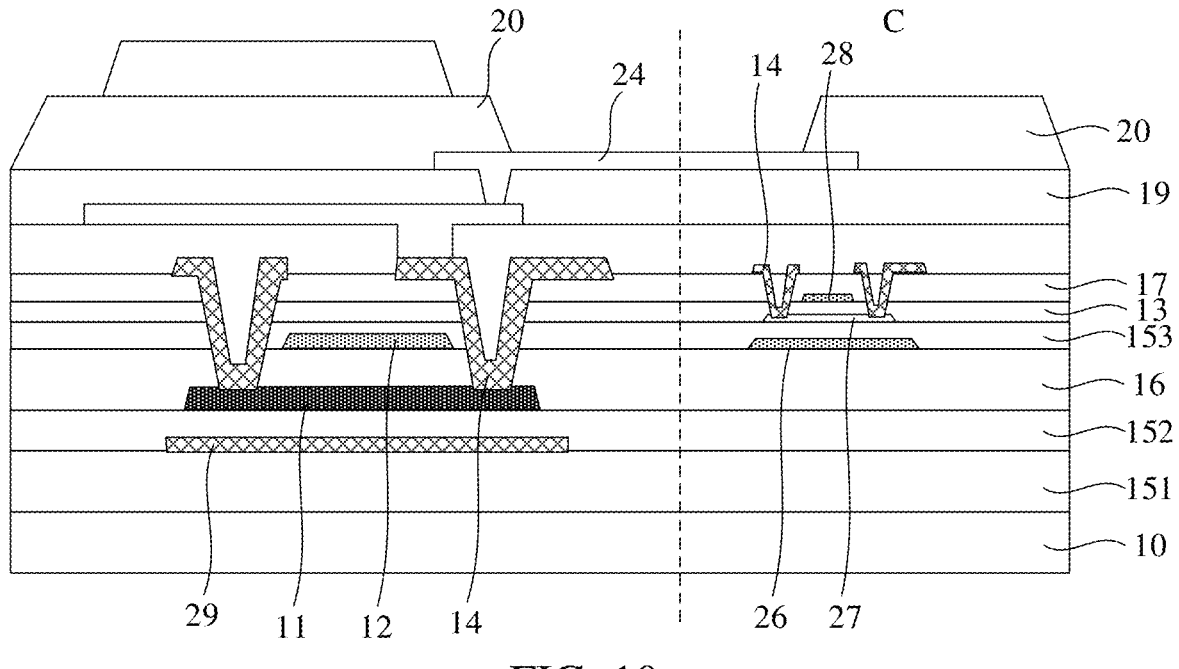
FIG. 10 schematically shows a schematic diagram of a structure of yet another display substrate according to an exemplary embodiment of the present disclosure.

FIG. 10 schematically shows a schematic diagram of a structure of yet another display substrate according to an exemplary embodiment of the present disclosure.

FIG. 10 shows a structure of another display substrate. The display substrate includes a second transistor disposed on the substrate 10 and located in a region where C is located in FIG. 10. The second transistor includes: a third gate 26 disposed on a side of the substrate 10; a second insulating layer 153 disposed on a side of the third gate 26 away from the substrate 10; a second active layer 27 disposed on a side of the second insulating layer 153 away from the substrate 10. The third gate 26 and the first gate 12 are located in the same layer, and the third gate 26 has the same stacked structure as the first gate 12.

The second transistor further includes a fourth gate 28 disposed on a side of the second active layer 27 away from the substrate 10, where the fourth gate 28 has the same stacked structure as the first gate 12.

In an embodiment of the present disclosure, the first active layer 11 includes a polysilicon material, and the second active layer 27 includes a semiconductor oxide material.

For example, the first active layer 12 may include a polysilicon semiconductor material (e.g., low temperature polysilicon), an amorphous silicon semiconductor material, a carbon nanotube material or other non-silicon-based semiconductor materials. In an embodiment of the present disclosure, the second active layer 27 may be made of oxide semiconductor, for example, it may include a ZnO-based oxide layer. The second active layer 27 may also include a Group III element such as In or Ga, a Group IV element such as Sn, a combination thereof, or other elements. For another example, the active layer 27 may include a Cu oxide layer (a $CUBO_2$ layer, a $CuAlO_2$ layer, a $CuGaO_2$ layer, a $CuInO_2$ layer, etc.), a Ni oxide layer, a Ni oxide layer doped with Ti, a ZnO based oxide layer doped with at least one of Group I, II, and V elements, a ZnO based oxide layer doped with Ag, a Pbs layer, a LaCuOs layer, or a LaCuoSe layer. As an example, the second active layer 27 may include Indium Gallium Zinc Oxide (abbreviated as IGZO), Indium Tin Zinc Oxide (abbreviated as ITZO), or Indium Zinc Oxide (abbreviated as IZO).

In an embodiment of the present disclosure, the display substrate further includes a shielding layer 29, where the shielding layer 29 is disposed between the first active layer 11 of the first transistor and the base substrate 10.

The present disclosure further provides a display device including the display substrate described above.

Some embodiments of the general technical concept of the present disclosure have been shown and described. However, those of ordinary skill in the art will appreciate that changes may be made to these embodiments without departing from the principles and spirit of the general technical concept, and the scope of the present disclosure is defined by the claims and their equivalents.

What is claimed is:

1. A thin film transistor, disposed on a base substrate, wherein the thin film transistor comprises:

a first active layer, disposed on a side of the base substrate;

a first gate, disposed on a side of the first active layer away from the base substrate;

a first insulating layer, disposed on a side of the first gate away from the base substrate;

a source and a drain, disposed on a side of the first insulating layer away from the base substrate, the source and the drain being electrically connected to the first active layer, wherein the first gate comprises a stacked structure comprising:

a first conductive layer; and a first barrier layer, disposed on a side of the first conductive layer away from the base substrate, wherein a side of the first barrier layer away from the base substrate is in direct contact with a side of the first insulating layer proximate to the base substrate; and wherein the first barrier layer comprises $TiN_{x1}$, wherein $0 < x1 < 0.2$, and x1 is a molar ratio of N to Ti;

wherein the stacked structure of the first gate further comprises:

a second barrier layer, disposed between the first conductive layer and the first barrier layer, wherein the second barrier layer comprises $TiN_{x2}$, and a material of the second barrier layer has a higher N content than that of a material of the first barrier layer, wherein $0.5 \leq x2 < 0.8$, and x2 is a molar ratio of N to Ti; and wherein the first barrier layer has a first grain size, the second barrier layer has a second grain size, and the first grain size is smaller than the second grain size.

2. The thin film transistor according to claim 1, wherein an adhesion force between a material of the first barrier layer and a material of the first insulating layer is greater than an adhesion force between a material of the second barrier layer and the material of the first insulating layer.

3. The thin film transistor according to claim 1, wherein a thickness of the first barrier layer is in a range of 30 nm to 150 nm; and/or, a thickness of the second barrier layer is in a range of 30 nm to 150 nm.

4. The thin film transistor according to claim 3, wherein a sum of the thicknesses of the first barrier layer and the thickness of the second barrier layer is in a range of 30 nm to 150 nm.

5. The thin film transistor according to claim 1, wherein the stacked structure of the first gate further comprises:

a third barrier layer, disposed between the first conductive layer and the base substrate, and the third barrier layer comprising $TiN_{x3}$, wherein $0 \leq x3 < 0.2$, and x3 is a molar ratio of N to Ti.

6. The thin film transistor according to claim 1, further comprising a second gate, wherein the second gate is disposed between the first active layer and the base substrate; and the second gate comprises a stacked structure, and the stacked structure of the second gate is the same as the stacked structure of the first gate.

7. The thin film transistor according to claim 1, wherein the first conductive layer comprises an aluminum alloy material.

8. A method for manufacturing a thin film transistor, comprising:

forming a first active layer on a base substrate;

forming a first gate on a side of the first active layer away from the base substrate;

forming a first insulating layer on a side of the first gate away from the base substrate;

forming a source and a drain on a side of the first insulating layer away from the base substrate, the source and the drain being electrically connected to the first active layer, wherein forming the first gate comprises:

forming a first conductive layer on the side of the first active layer away from the base substrate; and forming a first barrier layer on a side of the first conductive layer away from the base substrate, a side of the first barrier layer away from the base substrate being in direct contact with a side of the first insulating layer proximate to the base substrate, wherein the first barrier layer comprises $TiN_{x1}$, wherein $0 \leq x1 < 0.2$, and x1 is a molar ratio of N to Ti.

9. The method for manufacturing a thin film transistor according to claim 8, further comprising:

forming a second gate on the base substrate before the first active layer is formed.

10. A display substrate, comprising:

a base substrate; and a first transistor disposed on the base substrate, wherein the first transistor is the thin film transistor according to claim 1.

11. The display substrate according to claim 10, further comprising a capacitor disposed on the base substrate, wherein the capacitor comprises a first capacitor electrode and a second capacitor electrode, the first capacitor electrode and the first gate are located in a same layer, the first capacitor electrode has a stacked structure, and the stacked structure of the first capacitor electrode is the same as the stacked structure of the first gate.

12. The display substrate according to claim 11, wherein the second capacitor electrode is electrically connected to the first active layer, the second capacitor electrode has a stacked structure, and the stacked structure of the second capacitor electrode is the same as the stacked structure of the first gate.

13. The display substrate according to claim 10, wherein the display substrate further comprises a second transistor disposed on the base substrate, and the second transistor comprises:

a third gate, disposed on a side of the base substrate;

a second insulating layer, disposed on a side of the third gate away from the base substrate; and a second active layer, disposed on a side of the second insulating layer away from the base substrate, wherein the third gate and the first gate are located in a same layer, and the third gate has a same stacked structure as the first gate.

14. The display substrate according to claim 13, wherein the second transistor further comprises:

a fourth gate, disposed on a side of the second active layer away from the base substrate, wherein the fourth gate has a same stacked structure as the first gate.

15. The display substrate according to claim 13, wherein the first active layer comprises a polysilicon material, and the second active layer comprises a semiconductor oxide material.

16. The display substrate according to claim 10, further comprising a shielding layer, wherein the shielding layer is disposed between the first active layer of the first transistor and the base substrate.

17. A display device comprising the display substrate according to claim 1.

* * * * *